United States Patent
Liu et al.

(10) Patent No.: US 7,858,533 B2
(45) Date of Patent: Dec. 28, 2010

(54) METHOD FOR CURING A POROUS LOW DIELECTRIC CONSTANT DIELECTRIC FILM

(75) Inventors: Junjun Liu, Austin, TX (US); Dorel I. Toma, Dripping Springs, TX (US); Eric M. Lee, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 22 days.

(21) Appl. No.: 12/043,772

(22) Filed: Mar. 6, 2008

(65) Prior Publication Data

US 2009/0227119 A1 Sep. 10, 2009

(51) Int. Cl.
*H01L 21/31* (2006.01)
*H01L 21/469* (2006.01)

(52) U.S. Cl. ....................................... 438/778

(58) Field of Classification Search .......... 438/778–788
See application file for complete search history.

(56) References Cited

U.S. PATENT DOCUMENTS

| | | | |
|---|---|---|---|
| 5,705,232 A | 1/1998 | Hwang et al. | |
| 6,303,524 B1 | 10/2001 | Sharangpani et al. | |
| 6,596,467 B2 * | 7/2003 | Gallagher et al. | 430/314 |
| 6,692,903 B2 | 2/2004 | Chen et al. | |
| 6,756,085 B2 | 6/2004 | Waldfried et al. | |
| 6,764,718 B2 | 7/2004 | Nakamura et al. | |
| 7,030,468 B2 | 4/2006 | Gates et al. | |
| 7,081,638 B1 | 7/2006 | Augur | |
| 7,098,149 B2 | 8/2006 | Lukas et al. | |
| 7,166,531 B1 | 1/2007 | Van Den Hoek et al. | |
| 7,166,963 B2 | 1/2007 | Janos et al. | |
| 7,223,670 B2 | 5/2007 | Callegari et al. | |
| 7,282,458 B2 | 10/2007 | Gates et al. | |
| 2003/0054115 A1 | 3/2003 | Albano et al. | |
| 2003/0224544 A1 | 12/2003 | Prisco et al. | |
| 2004/0018319 A1 * | 1/2004 | Waldfried et al. | 427/508 |
| 2004/0096593 A1 * | 5/2004 | Lukas et al. | 427/558 |
| 2004/0096672 A1 * | 5/2004 | Lukas et al. | 428/446 |
| 2004/0175501 A1 | 9/2004 | Lukas et al. | |
| 2004/0253839 A1 | 12/2004 | Shimizu et al. | |
| 2005/0085094 A1 * | 4/2005 | Yoo | 438/770 |
| 2005/0272220 A1 | 12/2005 | Waldfried et al. | |
| 2006/0024976 A1 | 2/2006 | Waldfried et al. | |
| 2006/0141806 A1 | 6/2006 | Waldfried et al. | |
| 2006/0165904 A1 | 7/2006 | Ohara | |
| 2006/0183345 A1 | 8/2006 | Nguyen et al. | |
| 2006/0202311 A1 | 9/2006 | Nguyen et al. | |
| 2006/0249078 A1 | 11/2006 | Nowak et al. | |
| 2006/0251827 A1 | 11/2006 | Nowak et al. | |
| 2006/0274405 A1 | 12/2006 | Waldfried et al. | |

(Continued)

OTHER PUBLICATIONS

Volksen et al., A Novel Post-Porosity Treatment for Significant Toughening of Low-k Organosilicates, IEEE, 2006, pp. 146-148.

(Continued)

*Primary Examiner*—Savitri Mulpuri
*Assistant Examiner*—Calvin Choi

(57) ABSTRACT

A method of curing a low dielectric constant (low-k) dielectric film on a substrate is described, wherein the dielectric constant of the low-k dielectric film is less than a value of approximately 4. The method comprises exposing the low-k dielectric film to infrared (IR) radiation and ultraviolet (UV) radiation.

26 Claims, 9 Drawing Sheets

U.S. PATENT DOCUMENTS

| | | |
|---|---|---|
| 2007/0105401 A1 | 5/2007 | Liu et al. |
| 2007/0161230 A1 | 7/2007 | Chen et al. |
| 2007/0228289 A1 | 10/2007 | Kaszuba et al. |
| 2007/0228618 A1 | 10/2007 | Kaszuba et al. |
| 2007/0257205 A1 | 11/2007 | Rocha Alvarez et al. |
| 2007/0284698 A1 | 12/2007 | Callegari et al. |
| 2007/0286963 A1 | 12/2007 | Rocha Alvarez et al. |
| 2008/0063809 A1 | 3/2008 | Lee et al. |
| 2009/0075491 A1 | 3/2009 | Liu et al. |

OTHER PUBLICATIONS

Abell et al., Solid State MAS NMR Spectroscopic Characterization of Plasma Damage and UV Modification of Low K Dielectric Films, Mater. Res. Soc. Symp. Proc., vol. 863, Materials Research Society, 2005, pp. B1.8.1-B1.8.6.

International Searching Authority, International Search Report and Written Opinion, International Application No. PCT/US09/35878, Mailed Apr. 23, 2009, 13 pages.

* cited by examiner

METHOD FOR CURING A POROUS LOW DIELECTRIC CONSTANT DIELECTRIC FILM

CROSS-REFERENCE TO RELATED APPLICATIONS

This application is related to pending U.S. patent application Ser. No. 11/269,581, entitled "MULTI-STEP SYSTEM AND METHOD FOR CURING A DIELECTRIC FILM", filed on Nov. 9, 2005, and pending U.S. patent application Ser. No. 11/517,358, entitled "THERMAL PROCESSING SYSTEM FOR CURING DIELECTRIC FILMS", filed on Sep. 8, 2006. Further, this application is related to co-pending U.S. patent application Ser. No. 12/043,814, entitled "METHOD FOR REMOVING A PORE-GENERATING MATERIAL FROM AN UNCURED LOW-K DIELECTRIC FILM" (TDC-007), filed on even date herewith; co-pending U.S. Patent Application No. 12/043,835, entitled "POROUS SiCOH-CONTAINING DIELECTRIC FILM AND A METHOD OF PREPARING" (TDC-008), filed on even date herewith; and co-pending U.S. patent application Ser. No. 12/043,850, entitled "METHOD FOR TREATING DIELECTRIC FILM WITH INFRARED RADIATION" (TDC-009), filed on even date herewith. The entire contents of these applications are herein incorporated by reference in their entirety.

BACKGROUND OF THE INVENTION

1. Field of the Invention

The invention relates to a method for treating a dielectric film and, more particularly, to a method of treating a low dielectric constant (low-k) dielectric film with electromagnetic (EM) radiation.

2. Description of Related Art

As is known to those in the semiconductor art, interconnect delay is a major limiting factor in the drive to improve the speed and performance of integrated circuits (IC). One way to minimize interconnect delay is to reduce interconnect capacitance by using low dielectric constant (low-k) materials as the insulating dielectric for metal wires in the IC devices. Thus, in recent years, low-k materials have been developed to replace relatively high dielectric constant insulating materials, such as silicon dioxide. In particular, low-k films are being utilized for inter-level and intra-level dielectric layers between metal wires in semiconductor devices. Additionally, in order to further reduce the dielectric constant of insulating materials, material films are formed with pores, i.e., porous low-k dielectric films. Such low-k films can be deposited by a spin-on dielectric (SOD) method similar to the application of photo-resist, or by chemical vapor deposition (CVD). Thus, the use of low-k materials is readily adaptable to existing semiconductor manufacturing processes.

Low-k materials are less robust than more traditional silicon dioxide, and the mechanical strength deteriorates further with the introduction of porosity. The porous low-k films can easily be damaged during plasma processing, thereby making desirable a mechanical strengthening process. It has been understood that enhancement of the material strength of porous low-k dielectrics is essential for their successful integration. Aimed at mechanical strengthening, alternative curing techniques are being explored to make porous low-k films more robust and suitable for integration.

The curing of a polymer includes a process whereby a thin film deposited for example using spin-on or vapor deposition (such as chemical vapor deposition CVD) techniques, is treated in order to cause cross-linking within the film. During the curing process, free radical polymerization is understood to be the primary route for cross-linking. As polymer chains cross-link, mechanical properties, such as for example the Young's modulus, the film hardness, the fracture toughness and the interfacial adhesion, are improved, thereby improving the fabrication robustness of the low-k film.

As there are various strategies to forming porous dielectric films with ultra low dielectric constant, the objectives of post-deposition treatments (curing) may vary from film to film, including for example the removal of moisture, the removal of solvents, the burn-out of porogens used to form the pores in the porous dielectric film, the improvement of the mechanical properties for such films, and so on.

Low dielectric constant (low k) materials are conventionally thermally cured at a temperature in the range of 300° C. to 400° C. for CVD films. For instance, furnace curing has been sufficient in producing strong, dense low-k films with a dielectric constant greater than approximately 2.5. However, when processing porous dielectric films (such as ultra low-k films) with a high level of porosity, the degree of cross-linking achievable with thermal treatment (or thermal curing) is no longer sufficient to produce films of adequate strength for a robust interconnect structure.

During thermal curing, an appropriate amount of energy is delivered to the dielectric film without damaging the dielectric film. Within the temperature range of interest, however, only a small amount of free radicals can be generated. Only a small amount of thermal energy can actually be absorbed in the low-k films to be cured due to the thermal energy lost in the coupling of heat to the substrate and the heat loss in the ambient environment. Therefore, high temperatures and long curing times are required for typical low-k furnace curing. But even with a high thermal budget, the lack of initiator generation in the thermal curing and the presence of a large amount of methyl termination in the as-deposited low-k film can make it very difficult to achieve the desired degree of cross-linking.

SUMMARY OF THE INVENTION

The invention relates to a method for treating a dielectric film and, more particularly, to a method of curing a low dielectric constant (low-k) dielectric film.

The invention further relates to a method of treating a low-k dielectric film with electromagnetic (EM) radiation.

According to an embodiment, a method of curing a low dielectric constant (low-k) dielectric film on a substrate is described, wherein the dielectric constant of the low-k dielectric film is less than a value of approximately 4. The method comprises exposing the low-k dielectric film to infrared (IR) radiation and ultraviolet (UV) radiation.

According to another embodiment, a method of curing a low dielectric constant (low-k) dielectric film on a substrate is described, comprising: forming a low-k dielectric film on a substrate; exposing the low-k dielectric film to a first infrared (IR) radiation; exposing the low-k dielectric film to ultraviolet (UV) radiation following the exposure to the first IR radiation; and exposing the low-k dielectric film to a second infrared (IR) radiation following the exposure to the UV radiation, wherein the dielectric constant of the low-k dielectric film is less than a value of approximately 4.

According to another embodiment, a method of curing a low dielectric constant (low-k) film on a substrate is described, comprising: forming a low-k dielectric film on a substrate, the low-k dielectric film comprising a structure-forming material and a pore-generating material; exposing the low-k dielectric film to infrared (IR) radiation for a first time duration; and during the first time duration, exposing the low-k dielectric film to ultraviolet (UV) radiation for a second time duration, wherein the second time duration is a fraction of the first time duration, and wherein the second time duration begins at a first time following the start of the first time duration and ends at a second time preceding the end of the first time duration.

According to yet another embodiment, a method of curing a low dielectric constant (low-k) dielectric film on a substrate is described, comprising: forming a low-k dielectric film on a substrate, the low-k dielectric film comprising a structure-forming material and a pore-generating material; substantially removing the pore-generating material from the low-k dielectric film to form a porous low-k dielectric film; generating cross-linking initiators in the porous low-k dielectric film following the removing; and cross-linking the porous low-k dielectric film following the generation of the cross-linking initiators.

DETAILED DESCRIPTION OF EXEMPLARY EMBODIMENTS

Figure 1:
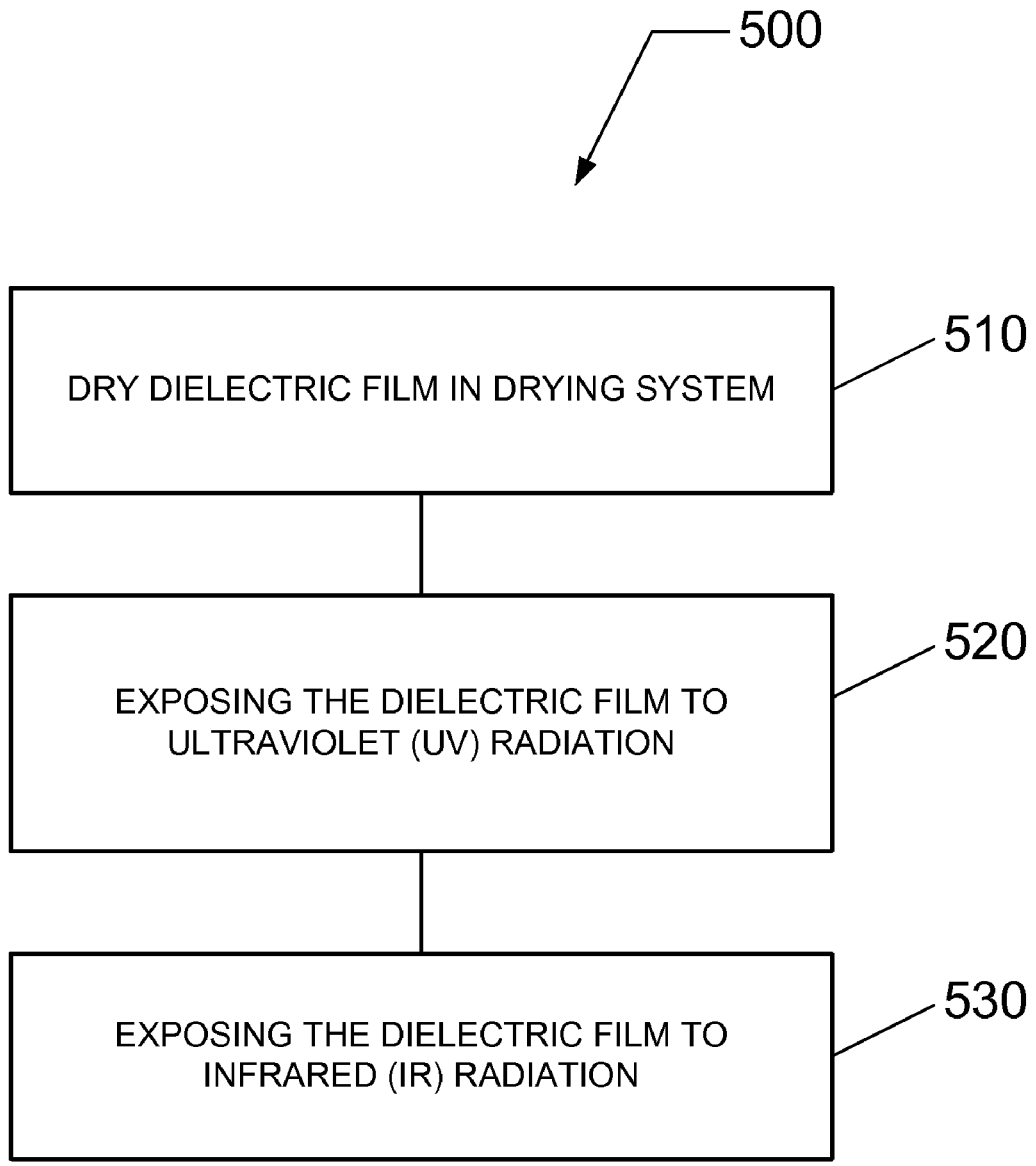
FIG. 1 is a flow chart of a method of treating a dielectric film according to an embodiment.

In the following description, in order to facilitate a thorough understanding of the invention and for purposes of explanation and not limitation, specific details are set forth, such as a particular geometry of the processing system and descriptions of various components and processes. However, it should be understood that the invention may be practiced in other embodiments that depart from these specific details.

The inventors recognized that alternative curing methods address some of the deficiencies of thermal curing alone. For instance, alternative curing methods are more efficient in energy transfer, as compared to thermal curing processes, and the higher energy levels found in the form of energetic particles, such as accelerated electrons, ions, or neutrals, or in the form of energetic photons, can easily excite electrons in a low-k dielectric film, thus efficiently breaking chemical bonds and dissociating side groups. These alternative curing methods facilitate the generation of cross-linking initiators (free radicals) and can improve the energy transfer required in actual cross-linking. As a result, the degree of cross-linking can be increased at a reduced thermal budget.

Additionally, the inventors have realized that, when film strength becomes a greater issue for the integration of low-k and ultra-low-k (ULK) dielectric films (dielectric constant less than approximately 2.5), alternative curing methods can improve the mechanical properties of such films. For example, electron beam (EB), ultraviolet (UV) radiation, infrared (IR) radiation and microwave (MW) radiation may be used to cure low-k films and ULK films in order to improve mechanical strength, while not sacrificing the dielectric property and film hydrophobicity.

However, although EB, UV, IR and MW curing all have their own benefits, these techniques also have limitations. High energy curing sources such as EB and UV can provide high energy levels to generate more than enough cross-linking initiators (free radicals) for cross-linking, which leads to much improved mechanical properties under complementary substrate heating. On the other hand, electrons and UV photons can cause indiscriminate dissociation of chemical bonds, which may adversely degrade the desired physical and electrical properties of the film, such as loss of hydrophobicity, increased residual film stress, collapse of pore structure, film densification and increased dielectric constant. Furthermore, low energy curing sources, such as MW curing, can provide significant improvements mostly in the heat transfer efficiency, but in the meantime have side effects, such as for example arcing or transistor damage (MW).

According to an embodiment, a method of curing a low dielectric constant (low-k) dielectric film on a substrate is described, wherein the dielectric constant of the low-k dielectric film is less than a value of approximately 4. The method comprises exposing the low-k dielectric film to non-ionizing, electromagnetic (EM) radiation, including ultraviolet (UV) radiation and infrared (IR) radiation. The UV exposure may comprise a plurality of UV exposures, wherein each UV exposure may or may not include a different intensity, power, power density, or wavelength range, or any combination of two or more thereof. The IR exposure may comprise a plurality of IR exposures, wherein each IR exposure may or may not include a different intensity, power, power density, or wavelength range, or any combination of two or more thereof.

During the UV exposure, the low-k dielectric film may be heated by elevating the temperature of the substrate to a UV thermal temperature ranging from approximately 200 degrees C. to approximately 600 degrees C. Alternatively, the UV thermal temperature ranges from approximately 300 degrees C. to approximately 500 degrees C. Alternatively, the UV thermal temperature ranges from approximately 350 degrees C. to approximately 450 degrees C. Substrate thermal heating may be performed by conductive heating, convective heating, or radiative heating, or any combination of two or more thereof.

During the IR exposure, the low-k dielectric film may be heated by elevating the temperature of the substrate to an IR thermal temperature ranging from approximately 200 degrees C. to approximately 600 degrees C. Alternatively, the IR thermal temperature ranges from approximately 300 degrees C. to approximately 500 degrees C. Alternatively, the IR thermal temperature ranges from approximately 350 degrees C. to approximately 450 degrees C. Substrate thermal heating may be performed by conductive heating, convective heating, or radiative heating, or any combination of two or more thereof.

Additionally, thermal heating may take place before UV exposure, during UV exposure, or after UV exposure, or any combination of two or more thereof. Additionally yet, thermal heating may take place before IR exposure, during IR exposure, or after IR exposure, or any combination of two or more thereof. Thermal heating may be performed by conductive heating, convective heating, or radiative heating, or any combination of two or more thereof.

Further, IR exposure may take place before the UV exposure, during the UV exposure, or after the UV exposure, or any combination of two or more thereof. Further yet, UV exposure may take place before the IR exposure, during the IR exposure, or after the IR exposure, or any combination of two or more thereof.

Preceding the UV exposure or the IR exposure or both, the low-k dielectric film may be heated by elevating the temperature of the substrate to a pre-thermal treatment temperature ranging from approximately 200 degrees C. to approximately 600 degrees C. Alternatively, the pre-thermal treatment temperature ranges from approximately 300 degrees C. to approximately 500 degrees C. and, desirably, the pre-thermal treatment temperature ranges from approximately 350 degrees C. to approximately 450 degrees C.

Following the UV exposure or the IR exposure or both, the low-k dielectric film may be heated by elevating the temperature of the substrate to a post-thermal treatment temperature ranging from approximately 200 degrees C. to approximately 600 degrees C. Alternatively, the post-thermal treatment temperature ranges from approximately 300 degrees C. to approximately 500 degrees C. and, desirably, the post-thermal treatment temperature ranges from approximately 350 degrees C. to approximately 450 degrees C.

Referring now to FIG. 1, a method of treating a dielectric film on a substrate is described according to another embodiment. The substrate to be treated may be a semiconductor, a metallic conductor, or any other substrate to which the dielectric film is to be formed upon. The dielectric film can have a dielectric constant value (before drying and/or curing, or after drying and/or curing, or both) less than the dielectric constant of $SiO_2$, which is approximately 4 (e.g., the dielectric constant for thermal silicon dioxide can range from 3.8 to 3.9). In various embodiments of the invention, the dielectric film may have a dielectric constant (before drying and/or curing, or after drying and/or curing, or both) of less than 3.0, a dielectric constant of less than 2.5, a dielectric constant of less than 2.2, or a dielectric constant of less than 1.7.

The dielectric film may be described as a low dielectric constant (low-k) film or an ultra-low-k film. The dielectric film may include at least one of an organic, inorganic, and inorganic-organic hybrid material. Additionally, the dielectric film may be porous or non-porous.

The dielectric film may, for instance, include a single phase or dual phase porous low-k film that includes a structure-forming material and a pore-generating material. The structure-forming material may include an atom, a molecule, or fragment of a molecule that is derived from a structure-forming precursor. The pore-generating material may include an atom, a molecule, or fragment of a molecule that is derived from a pore-generating precursor (e.g., porogen). The single phase or dual phase porous low-k film may have a higher dielectric constant prior to removal of the pore-generating material than following the removal of the pore-generating material.

For example, forming a single phase porous low-k film may include depositing a structure-forming molecule having a pore-generating molecular side group weakly bonded to the structure-forming molecule on a surface of a substrate. Additionally, for example, forming a dual phase porous low-k film may include co-polymerizing a structure-forming molecule and a pore-generating molecule on a surface of a substrate.

Additionally, the dielectric film may have moisture, water, solvent, and/or other contaminants which cause the dielectric constant to be higher prior to drying and/or curing than following drying and/or curing.

The dielectric film can be formed using chemical vapor deposition (CVD) techniques, or spin-on dielectric (SOD) techniques such as those offered in the CLEAN TRACK ACT 8 SOD (a spin coating machine for semiconductor processing) and CLEAN TRACK ACT 12 SOD (a spin coating machine for semiconductor processing) coating systems commercially available from Tokyo Electron Limited (TEL). The CLEAN TRACK ACT 8 (200 mm) and CLEAN TRACK ACT 12 (300 mm) coating systems provide coat, bake, and cure tools for SOD materials. The track system can be configured for processing substrate sizes of 100 mm, 200 mm, 300 mm, and greater. Other systems and methods for forming a dielectric film on a substrate as known to those skilled in the art of both spin-on dielectric technology and CVD dielectric technology are suitable for the invention.

For example, the dielectric film may include an inorganic, silicate-based material, such as oxidized organosilane (or organo siloxane), deposited using CVD techniques. Examples of such films include BLACK DIAMOND CVD organosilicate glass (OSG) films (insulating material for semiconductor processing) commercially available from Applied Materials, Inc., or CORAL CVD films (insulating material for semiconductor processing) commercially available from Novellus Systems, Inc.

Additionally, for example, porous dielectric films can include single-phase materials, such as a silicon oxide-based matrix having terminal organic side groups that inhibit cross-linking during a curing process to create small voids (or pores). Additionally, for example, porous dielectric films can include dual-phase materials, such as a silicon oxide-based matrix having inclusions of organic material (e.g., a porogen) that is decomposed and evaporated during a curing process.

Alternatively, the dielectric film may include an inorganic, silicate-based material, such as hydrogen silsesquioxane (HSQ) or methyl silsesquioxane (MSQ), deposited using SOD techniques. Examples of such films include FOx® HSQ (insulating material for semiconductor processing) commercially available from Dow Corning Corporation, XLK porous HSQ (insulating material for semiconductor processing) commercially available from Dow Corning Corporation, and JSR LKD-5109 (insulating material for semiconductor processing) commercially available from JSR Microelectronics.

Still alternatively, the dielectric film can include an organic material deposited using SOD techniques. Examples of such films include SILK-I, SILK-J, SILK-H, SILK-D, porous SILK-T, porous SILK-Y, and porous SILK-Z semiconductor dielectric resins (insulating materials for semiconductor processing) commercially available from Dow Chemical Company, and FLARE and NANOGLASS (insulating materials for semiconductor processing) commercially available from Honeywell International, Inc.

The method includes a flow chart 500 beginning in 510 with optionally drying the dielectric film on the substrate in a first processing system. The first processing system may include a drying system configured to remove, or partially remove, one or more contaminants in the dielectric film, including, for example, moisture, water, solvent, pore-generating material, residual pore-generating material, pore-generating molecules, fragments of pore-generating molecules, or any other contaminant that may interfere with a subsequent curing process.

In 520, the dielectric film is exposed to UV radiation. The UV exposure may be performed in a second processing system. The second processing system may include a curing system configured to perform a UV-assisted cure of the dielectric film by causing or partially causing cross-linking within the dielectric film in order to, for example, improve the mechanical properties of the dielectric film. Following the drying process, the substrate can be transferred from the first processing system to the second processing system under vacuum in order to minimize contamination.

The exposure of the dielectric film to UV radiation may include exposing the dielectric film to UV radiation from one or more UV lamps, one or more UV LEDs (light-emitting diodes), or one or more UV lasers, or a combination of two or more thereof. The UV radiation may range in wavelength from approximately 100 nanometers (nm) to approximately 600 nm. Alternatively, the UV radiation may range in wavelength from approximately 200 nm to approximately 400 nm. Alternatively, the UV radiation may range in wavelength from approximately 150 nm to approximately 300 nm. Alternatively, the UV radiation may range in wavelength from approximately 170 nm to approximately 240 nm. Alternatively, the UV radiation may range in wavelength from approximately 200 nm to approximately 240 nm.

During the exposure of the dielectric film to UV radiation, the dielectric film may be heated by elevating the temperature of the substrate to a UV thermal temperature ranging from approximately 200 degrees C. to approximately 600 degrees C. Alternatively, the UV thermal temperature can range from approximately 300 degrees C. to approximately 500 degrees C. Alternatively, the UV thermal temperature can range from approximately 350 degrees C. to approximately 450 degrees C. Alternatively, before the exposure of the dielectric film to UV radiation or after the exposure of the dielectric film to UV radiation or both, the dielectric film may be heated by elevating the temperature of the substrate. Heating of the substrate may include conductive heating, convective heating, or radiative heating, or any combination of two or more thereof.

Optionally, during the exposure of the dielectric film to UV radiation, the dielectric film may be exposed to IR radiation. The exposure of the dielectric film to IR radiation may include exposing the dielectric film to IR radiation from one or more IR lamps, one or more IR LEDs (light emitting diodes), or one or more IR lasers, or a combination of two or more thereof. The IR radiation may range in wavelength from approximately 1 micron to approximately 25 microns. Alternatively, the IR radiation may range in wavelength from approximately 2 microns to approximately 20 microns. Alternatively, the IR radiation may range in wavelength from approximately 8 microns to approximately 14 microns. Alternatively, the IR radiation may range in wavelength from approximately 8 microns to approximately 12 microns. Alternatively, the IR radiation may range in wavelength from approximately 9 microns to approximately 10 microns.

In 530, the dielectric film is exposed to IR radiation. The exposure of the dielectric film to IR radiation may include exposing the dielectric film to IR radiation from one or more IR lamps, one or more IR LEDs (light emitting diodes), or one or more IR lasers, or both. The IR radiation may range in wavelength from approximately 1 micron to approximately 25 microns. Alternatively, the IR radiation may range in wavelength from approximately 2 microns to approximately 20 microns. Alternatively, the IR radiation may range in wavelength from approximately 8 microns to approximately 14 microns. Alternatively, the IR radiation may range in wavelength from approximately 8 microns to approximately 12 microns. Alternatively, the IR radiation may range in wavelength from approximately 9 microns to approximately 10 microns. The IR exposure may take place before the UV exposure, during the UV exposure, or after the UV exposure, or any combination of two or more thereof.

Furthermore, during the exposure of the dielectric film to IR radiation, the dielectric film may be heated by elevating the temperature of the substrate to an IR thermal treatment temperature ranging from approximately 200 degrees C. to approximately 600 degrees C. Alternatively, the IR thermal treatment temperature can range from approximately 300 degrees C. to approximately 500 degrees C. Alternatively yet, the IR thermal treatment temperature can range from approximately 350 degrees C. to approximately 450 degrees C. Alternatively, before the exposure of the dielectric film to IR radiation or after the exposure of the dielectric film to IR radiation or both, the dielectric film may be heated by elevating the temperature of the substrate. Heating of the substrate may include conductive heating, convective heating, or radiative heating, or any combination of two or more thereof.

As described above, during the IR exposure, the dielectric film may be heated through absorption of IR energy. However, the heating may further include conductively heating the substrate by placing the substrate on a substrate holder, and heating the substrate holder using a heating device. For example, the heating device may include a resistive heating element.

The inventors have recognized that the energy level (hv) delivered can be varied during different stages of the curing process. The curing process can include mechanisms for the removal of moisture and/or contaminants, the removal of pore-generating material, the decomposition of pore-generating material, the generation of cross-linking initiators, the cross-linking of the dielectric film, and the diffusion of the cross-linking initiators. Each mechanism may require a different energy level and rate at which energy is delivered to the dielectric film.

For instance, during the removal of pore-generating material, the removal process may be facilitated by photon absorption at IR wavelengths. The inventors have discovered that IR exposure assists the removal of pore-generating material more efficiently than thermal heating or UV exposure.

Additionally, for instance, during the removal of pore-generating material, the removal process may be assisted by decomposition of the pore-generating material. The removal process may include IR exposure that is complemented by UV exposure. The inventors have discovered that UV exposure may assist a removal process having IR exposure by dissociating bonds between pore-generating material (e.g., pore-generating molecules and/or pore-generating molecular fragments) and the structure-forming material. For example, the removal and/or decomposition processes may be assisted by photon absorption at UV wavelengths (e.g., about 300 nm to about 450 nm).

Furthermore, for instance, during the generation of cross-linking initiators, the initiator generation process may be facilitated by using photon and phonon induced bond dissociation within the structure-forming material. The inventors have discovered that the initiator generation process may be facilitated by UV exposure. For example, bond dissociation can require energy levels having a wavelength less than or equal to approximately 300 to 400 nm.

Further yet, for instance, during cross-linking, the cross-linking process can be facilitated by thermal energy sufficient for bond formation and reorganization. The inventors have discovered that cross-linking may be facilitated by IR exposure or thermal heating or both. For example, bond formation and reorganization may require energy levels having a wavelength of approximately 9 microns which, for example, corresponds to the main absorbance peak in siloxane-based organosilicate low-k materials.

The drying process for the dielectric film, the IR exposure of the dielectric film, and the UV exposure of the dielectric film may be performed in the same processing system, or each may be performed in separate processing systems. For example, the drying process may be performed in the first processing system and the IR exposure and the UV exposure may be performed in the second processing system. Alternatively, for example, the IR exposure of the dielectric film may be performed in a different processing system than the UV exposure. The IR exposure of the dielectric film may be performed in a third processing system, wherein the substrate can be transferred from the second processing system to the third processing system under vacuum in order to minimize contamination.

Additionally, following the optional drying process, the UV exposure process, and the IR exposure process, the dielectric film may optionally be post-treated in a post-treatment system configured to modify the cured dielectric film. For example, post-treatment may include thermal heating the dielectric film. Alternatively, for example, post-treatment may include spin coating or vapor depositing another film on the dielectric film in order to promote adhesion for subsequent films or improve hydrophobicity. Alternatively, for example, adhesion promotion may be achieved in a post-treatment system by lightly bombarding the dielectric film with ions. Moreover, the post-treatment may comprise performing one or more of depositing another film on the dielectric film, cleaning the dielectric film, or exposing the dielectric film to plasma.

Figure 2:
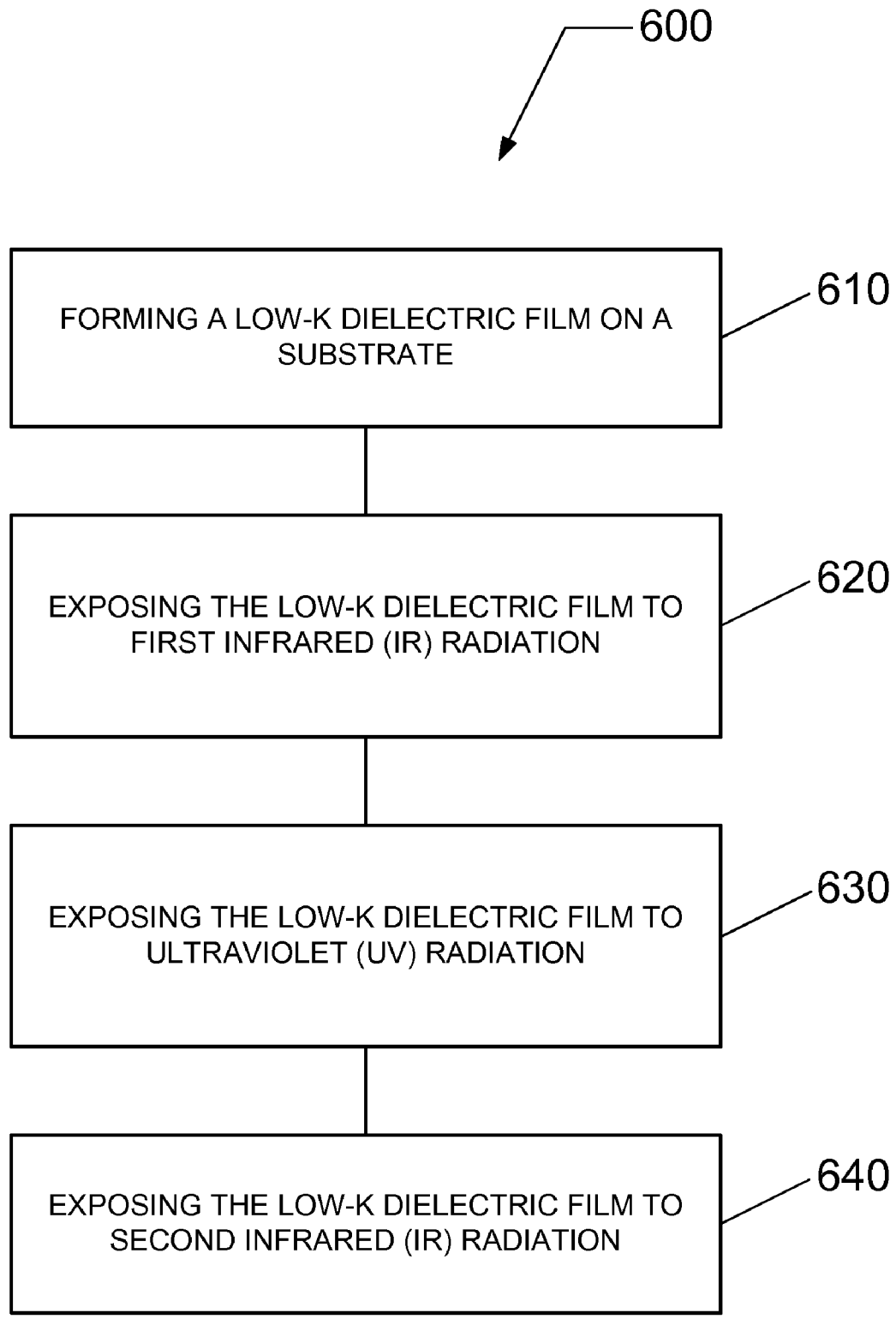
FIG. 2 is a flow chart of a method of treating a dielectric film according to another embodiment.

Referring now to FIG. 2, a method of treating a dielectric film on a substrate is described according to another embodiment. The method includes a flow chart 600 beginning in 610 with forming a dielectric film, such as a low-k dielectric film, on the substrate. Optionally, a drying process may be performed to remove, or partially remove, one or more contaminants in the dielectric film, including, for example, moisture, solvent, or any other contaminant that may interfere with producing a high quality low-k dielectric film, or performing a subsequent process.

In 620, the dielectric film is exposed to first IR radiation. For example, the exposure of the dielectric film to the first IR radiation may facilitate the full removal or partial removal of moisture, water, contaminants, pore-generating material, residual pore-generating material, pore-generating material including pore-generating molecules and/or fragments of pore-generating molecules, cross-linking inhibitors, or residual cross-linking inhibitors, or any combination of two or more thereof from the dielectric film. The exposure of the dielectric film may be performed for a time duration sufficiently long to substantially remove all moisture, water, contaminants, pore-generating material, residual pore-generating material, pore-generating material including pore-generating molecules and/or fragments of pore-generating molecules, cross-linking inhibitors, and residual cross-linking inhibitors, or any combination of two or more thereof from the dielectric film.

The exposure of the dielectric film to first IR radiation may include exposing the dielectric film to polychromatic IR radiation, monochromatic IR radiation, pulsed IR radiation, or continuous wave IR radiation, or a combination of two or more thereof. For example, the exposure of the dielectric film to first IR radiation may include exposing the dielectric film to IR radiation from one or more IR lamps, one or more IR LEDs (light emitting diodes), or one or more IR lasers, or a combination thereof. The first IR radiation may comprise a power density ranging up to about 20 W/cm². For example, the first IR radiation may comprise a power density ranging from about 1 W/cm² to about 20 W/cm². The first IR radiation may range in wavelength from approximately 1 micron to approximately 25 microns. Alternatively, the first IR radiation may range in wavelength from approximately 2 microns to approximately 20 microns. Alternatively, the first IR radiation may range in wavelength from approximately 8 microns to approximately 14 microns. Alternatively, the first IR radiation may range in wavelength from approximately 8 microns to approximately 12 microns. Alternatively, the first IR radiation may range in wavelength from approximately 9 microns to approximately 10 microns. The first IR power density, or the first IR wavelength, or both, may be varied during the first IR exposure.

Optionally, during the first IR exposure, the dielectric film may be heated by elevating the temperature of the substrate to a first IR thermal treatment temperature ranging from approximately 200 degrees C. to approximately 600 degrees C. Alternatively, the first IR thermal treatment temperature can range from approximately 300 degrees C. to approximately 500 degrees C. Alternatively yet, the first IR thermal treatment temperature can range from approximately 350 degrees C. to approximately 450 degrees C.

In 630, the dielectric film is exposed to UV radiation following the first IR exposure. For example, the exposure of the substrate to the UV radiation may facilitate the generation of cross-linking initiators (or free radicals) in the dielectric film.

The exposure of the dielectric film to UV radiation may include exposing the dielectric film to polychromatic UV radiation, monochromatic UV radiation, pulsed UV radiation, or continuous wave UV radiation, or a combination of two or more thereof. For example, the exposure of the dielectric film to UV radiation may include exposing the dielectric film to UV radiation from one or more UV lamps, one or more UV LEDs (light emitting diodes), or one or more UV lasers, or a combination thereof. The UV radiation may comprise a power density ranging from approximately 0.1 mW/cm² to approximately 2000 mW/cm². The UV radiation may range in wavelength from approximately 100 nanometers (nm) to approximately 600 nm. Alternatively, the UV radiation may range in wavelength from approximately 200 nm to approximately 400 nm. Alternatively, the UV radiation may range in wavelength from approximately 150 nm to approximately 300 nm. Alternatively, the UV radiation may range in wavelength from approximately 170 nm to approximately 240 nm. Alternatively, the UV radiation may range in wavelength from approximately 200 nm to approximately 240 nm.

Optionally, during the UV exposure, the dielectric film may be heated by elevating the temperature of the substrate to a UV thermal treatment temperature ranging from approximately 200 degrees C. to approximately 600 degrees C. Alternatively, the UV thermal treatment temperature can range from approximately 300 degrees C. to approximately 500 degrees C. Alternatively yet, the UV thermal treatment temperature can range from approximately 350 degrees C. to approximately 450 degrees C.

In 640, the dielectric film is exposed to second IR radiation. For example, the exposure of the dielectric film to the second IR radiation may facilitate cross-linking of the dielectric film.

The exposure of the dielectric film to second IR radiation may include exposing the dielectric film to polychromatic IR radiation, monochromatic IR radiation, pulsed IR radiation, or continuous wave IR radiation, or a combination of two or more thereof. For example, the exposure of the dielectric film to second IR radiation may include exposing the dielectric film to IR radiation from one or more IR lamps, one or more IR LEDs (light emitting diodes), or one or more IR lasers, or a combination thereof. The second IR radiation may comprise a power density ranging up to about 20 W/cm². For example, the second IR radiation may comprise a power density ranging from about 1 W/cm² to about 20 W/cm². The second IR radiation may range in wavelength from approximately 1 micron to approximately 25 microns. Alternatively, the second IR radiation may range in wavelength from approximately 2 microns to approximately 20 microns. Alternatively, the second IR radiation may range in wavelength from approximately 8 microns to approximately 14 microns. Alternatively, the second IR radiation may range in wavelength from approximately 8 microns to approximately 12 microns. Alternatively, the second IR radiation may range in wavelength from approximately 9 microns to approximately 10 microns. The second IR power density, or the second IR wavelength, or both may be varied during the second IR exposure.

Optionally, during the second IR exposure, the dielectric film may be heated by elevating the temperature of the substrate to a second IR thermal treatment temperature ranging from approximately 200 degrees C. to approximately 600 degrees C. Alternatively, the second IR thermal treatment temperature can range from approximately 300 degrees C. to approximately 500 degrees C. Alternatively yet, the second IR thermal treatment temperature can range from approximately 350 degrees C. to approximately 450 degrees C.

Optionally, during at least a portion of the first IR exposure, the dielectric film may be exposed to second UV radiation. For example, the exposure of the dielectric film to the second UV radiation may facilitate the breaking or dissociating of bonds in the dielectric film in order to assist the removal of various materials described above. The second UV radiation may comprise a UV power density ranging from approximately 0.1 mW/cm$^2$ to approximately 2000 mW/cm$^2$. The second UV radiation may range in wavelength from approximately 100 nanometers (nm) to approximately 600 nm. Alternatively, the second UV radiation may range in wavelength from approximately 200 nm to approximately 400 nm. Alternatively, the second UV radiation may range in wavelength from approximately 150 nm to approximately 300 nm. Alternatively, the second UV radiation may range in wavelength from approximately 170 nm to approximately 240 nm. Alternatively, the second UV radiation may range in wavelength from approximately 200 nm to approximately 240 nm.

Optionally, during at least a portion of the UV exposure, the dielectric film may be exposed to third IR radiation. The third IR radiation may comprise a power density ranging up to about 20 W/cm$^2$. For example, the third IR radiation may comprise a power density ranging from about 1 W/cm$^2$ to about 20 W/cm$^2$. The third IR radiation may range in wavelength from approximately 1 micron to approximately 25 microns. Alternatively, the third IR radiation may range in wavelength from approximately 2 microns to approximately 20 microns. Alternatively, the third IR radiation may range in wavelength from approximately 8 microns to approximately 14 microns. Alternatively, the third IR radiation may range in wavelength from approximately 8 microns to approximately 12 microns. Alternatively, the third IR radiation may range in wavelength from approximately 9 microns to approximately 10 microns. The third IR power density, or the third IR wavelength, or both may be varied during the third IR exposure.

Preceding the UV exposure or the first IR exposure or both, the dielectric film may be heated by elevating the temperature of the substrate to a pre-thermal treatment temperature ranging from approximately 200 degrees C. to approximately 600 degrees C. Alternatively, the pre-thermal treatment temperature ranges from approximately 300 degrees C. to approximately 500 degrees C. and, desirably, the pre-thermal treatment temperature ranges from approximately 350 degrees C. to approximately 450 degrees C.

Following the UV exposure or the second IR exposure or both, the dielectric film may be heated by elevating the temperature of the substrate to a post-thermal treatment temperature ranging from approximately 200 degrees C. to approximately 600 degrees C. Alternatively, the post-thermal treatment temperature ranges from approximately 300 degrees C. to approximately 500 degrees C. and, desirably, the post-thermal treatment temperature ranges from approximately 350 degrees C. to approximately 450 degrees C.

According to another embodiment, a method of curing a low dielectric constant (low-k) film on a substrate is described. The method comprises forming a low-k dielectric film on a substrate, wherein the low-k dielectric film comprises a structure-forming material and a pore-generating material. The low-k dielectric film is exposed to infrared (IR) radiation for a first time duration. During the first time duration, the low-k dielectric film is exposed to ultraviolet (UV) radiation for a second time duration, wherein the second time duration is a fraction of the first time duration, and wherein the second time duration begins at a first time following the start of the first time duration and ends at a second time preceding the end of the first time duration.

Figure 3:
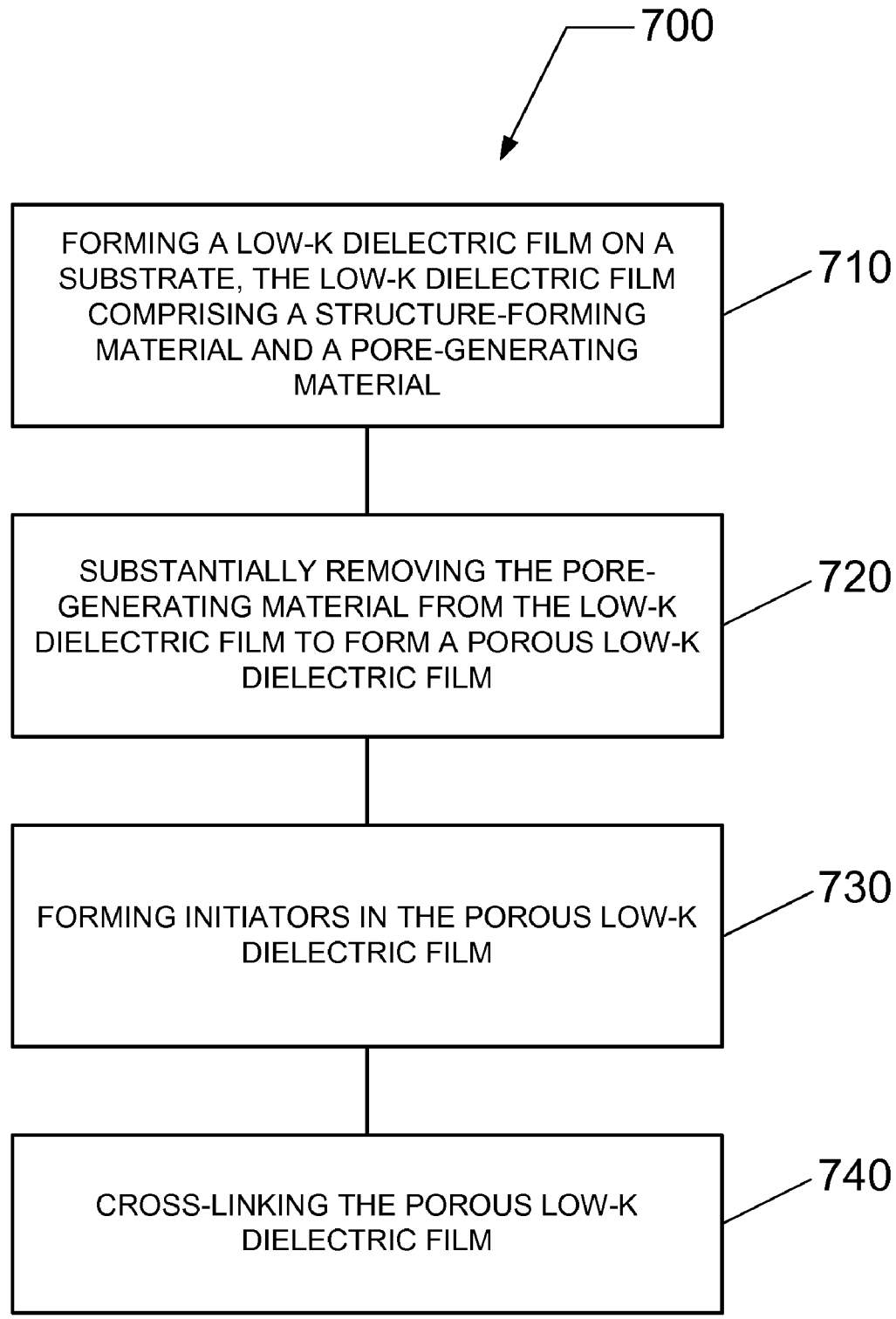
FIG. 3 is a flow chart of a method of treating a dielectric film according to another embodiment.

Referring to FIG. 3, a method of curing a low dielectric constant (low-k) dielectric film on a substrate is described according to yet another embodiment. The method comprises a flow chart 700 beginning in 710 with forming a low-k dielectric film on a substrate, wherein the low-k dielectric film comprises a structure-forming material and a pore-generating material. In 720, the pore-generating material is substantially removed from the low-k dielectric film to form a porous low-k dielectric film. Furthermore, in 720, cross-linking inhibitors may be substantially removed. The cross-linking inhibitors may include moisture, water, contaminants, pore-generating material, residual pore-generating material, or pore-generating material including pore-generating molecules and/or fragments of pore-generating molecules, or any combination of two or more thereof.

In 730, cross-linking initiators are generated in the porous low-k dielectric film following the removal of the pore-generating material. In 740, the structure-forming material of the porous low-k dielectric film is cross-linked following the generating the cross-linking initiators.

Furthermore, the method may optionally include breaking bonds in the low-k dielectric film in order to assist the removing.

Figure 4:
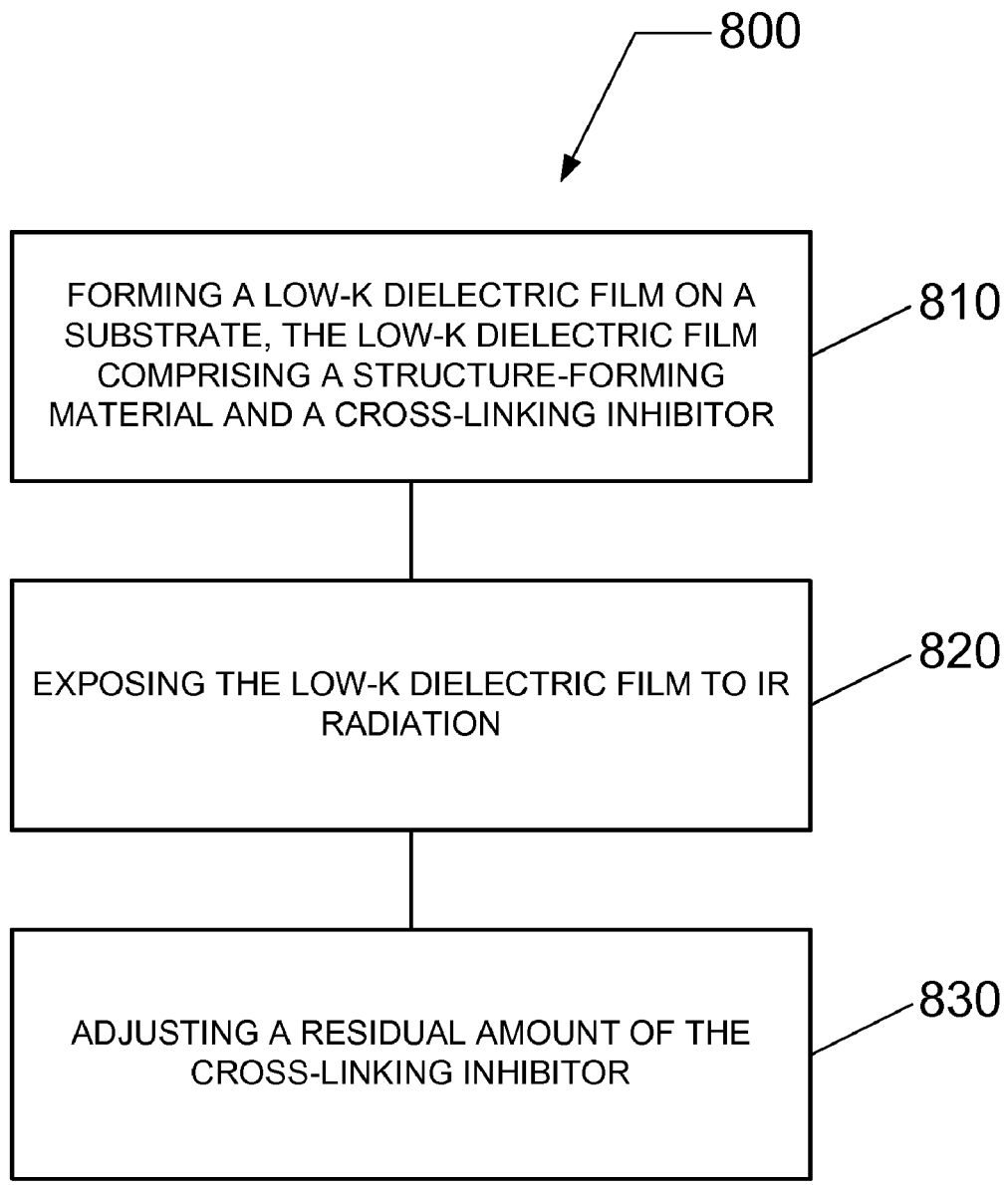
FIG. 4 is a flow chart of a method of treating a dielectric film according to another embodiment.

Referring to FIG. 4, a method of curing a low dielectric constant (low-k) dielectric film on a substrate is described according to yet another embodiment. The method comprises a flow chart 800 beginning in 810 with forming a low-k dielectric film on a substrate, wherein the low-k dielectric film comprises a structure-forming material and a cross-linking inhibitor. The cross-linking inhibitor may include moisture, water, solvent, contaminants, pore-generating material, residual pore-generating material, a weakly bonded side group to the structure-forming material, pore-generating molecules, or fragments of pore-generating molecules, or any combination of two or more thereof. For example, the cross-linking inhibitor may comprise a pore-generating material, wherein the low-k dielectric film having the structure-forming material and the cross-linking inhibitor comprises co-polymerizing a structure-forming molecule and a pore-generating molecule on a surface of the substrate. Additionally, for example, the cross-linking inhibitor may comprise a pore-generating material, wherein the low-k dielectric film having the structure-forming material and the cross-linking inhibitor comprises depositing a structure-forming molecule having a pore-generating molecular side group weakly bonded to the structure-forming molecule on a surface of the substrate.

In 820, the low-k dielectric film is exposed to infrared (IR) radiation. The exposure of the low-k dielectric film to IR radiation can comprise exposing the low-k dielectric film to polychromatic IR radiation, monochromatic IR radiation, pulsed IR radiation, or continuous wave IR radiation, or a combination of two or more thereof. The exposure of the low-k dielectric film to IR radiation can comprise exposing the low-k dielectric film to IR radiation with a wavelength ranging from approximately 8 microns to approximately 12 microns.

Optionally, the low-k dielectric film may be exposed to ultraviolet (UV) radiation. The exposure of the low-k dielectric film to UV radiation may comprise exposing the low-k dielectric film to polychromatic UV radiation, monochromatic UV radiation, pulsed UV radiation, or continuous wave UV radiation, or a combination of two or more thereof. The exposure of the low-k dielectric film to UV radiation may comprise exposing the low-k dielectric film to UV radiation with a wavelength ranging from approximately 100 nanometers to approximately 600 nanometers. The UV exposure may follow the IR exposure. Alternatively, the UV exposure may occur during part or all of the IR exposure. For example, the UV exposure occurring during the IR exposure may comprise a wavelength ranging from approximately 300 nanometers to approximately 450 nanometers.

In 830, a residual amount of the cross-linking inhibitor is adjusted in order to tune a mechanical property of the low-k dielectric film, an electrical property of the low-k dielectric film, an optical property of the low-k dielectric film, a pore size of the low-k dielectric film, or a porosity of the low-k dielectric film, or a combination of two or more thereof. The residual amount of cross-linking inhibitor may affect other properties including carbon concentration, hydrophobicity, and plasma resistance.

The mechanical property may comprise an elastic modulus (E), or a hardness (H), or both. The electrical property may comprise a dielectric constant (k). The optical property may comprise a refractive index (n).

The adjusting of the residual amount of the cross-linking inhibitor may comprise substantially removing the cross-linking inhibitor from the low-k dielectric film during the IR exposure. For example, the cross-linking inhibitor may be substantially removed prior to any exposure of the low-k dielectric film to ultraviolet (UV) radiation.

Alternatively, the adjusting of the residual amount of the cross-linking inhibitor may comprise adjusting a time duration for the IR exposure, an IR intensity for the IR exposure, or an IR dose for the IR exposure, or a combination of two or more thereof.

Alternatively, the adjusting of the residual amount of the cross-linking inhibitor may comprise adjusting a time duration for the UV exposure during the IR exposure, a UV intensity for the UV exposure, or a UV dose for the UV exposure, or a combination of two or more thereof.

The method may further comprise exposing the low-k dielectric film to ultraviolet (UV) radiation following the IR exposure, and exposing the low-k dielectric film to second IR radiation during the UV exposure. Additionally, the method may further comprise exposing the low-k dielectric film to third IR radiation following the UV exposure.

Furthermore, the method may comprise exposing the low-k dielectric film to first ultraviolet (UV) radiation following the IR exposure, and exposing the low-k dielectric film to second UV radiation during the IR exposure, wherein the second UV exposure is different than the first UV exposure.

The adjusting of the residual amount of the cross-linking inhibitor may comprise adjusting a time duration for the second UV exposure during the IR exposure, a UV intensity for the second UV exposure, or a UV dose for the second UV exposure, or a combination of two or more thereof. The exposure of the dielectric film to the second UV radiation may comprise a wavelength ranging from approximately 300 nanometers to approximately 450 nanometers.

Optionally, the low-k dielectric film may be heated before the IR exposure, during the IR exposure, or after the IR exposure, or any combination of two or more thereof.

IR treatment(s) may be performed in vacuum conditions or a controlled atmosphere.

According to one example, the structure-forming material may comprise diethoxymethylsilane (DEMS), and the pore-generating material may comprise a terpene; a norbornene; 5-dimethyl-1,4-cyclooctadiene; decahydronaphthalene; ethylbenzene; or limonene; or a combination of two or more thereof. For example, the pore-generating material may comprise alpha-terpinene (ATRP).

According to another example, a method of preparing a porous low-k dielectric film on a substrate is described. The method comprises: forming a SiCOH-containing dielectric film on a substrate using a chemical vapor deposition (CVD) process, wherein the CVD process uses diethoxymethylsilane (DEMS) and a pore-generating material; exposing the SiCOH-containing dielectric film to IR radiation for a first time duration sufficiently long to substantially remove the pore-generating material; exposing the SiCOH-containing dielectric film to UV radiation for a second time duration following the IR exposure; and heating the SiCOH-containing dielectric film during part or all of said second time duration.

The exposure of the SiCOH-containing dielectric film to IR radiation can comprise IR radiation with a wavelength ranging from approximately 9 microns to approximately 10 microns (e.g., 9.4 microns). The exposure of the SiCOH-containing dielectric film to UV radiation can comprise UV radiation with a wavelength ranging from approximately 170 nanometers to approximately 240 nanometers (e.g., 222 nm). The heating of the SiCOH-containing dielectric film can comprise heating the substrate to a temperature ranging from approximately 300 degrees C. to approximately 500 degrees C.

The IR exposure and the UV exposure may be performed in separate process chambers, or the IR exposure and the UV exposure may be performed in the same process chamber.

The pore-generating material may comprise a terpene; a norborene; 5-dimethyl-1,4-cyclooctadiene; decahydronaphthalene; ethylbenzene; or limonene; or a combination of two or more thereof. For example, the pore-generating material may comprise alpha-terpinene (ATRP).

Table 1 provides data for a porous low-k dielectric film intended to have a dielectric constant of about 2.2 to 2.25. The porous low-k dielectric film comprises a porous SiCOH-containing dielectric film formed with a CVD process using a structure-forming material comprising diethoxymethylsilane (DEMS) and a pore-generating material comprising alpha-terpinene (ATRP). The "Pristine" SiCOH-containing dielectric film having a nominal thickness (Angstroms, A) and refractive index (n) is first exposed to IR radiation resulting in a "Post-IR" thickness (A) and "Post-IR" refractive index (n). Thereafter, the "Post-IR" SiCOH-containing dielectric film is exposed to UV radiation while being thermally heated resulting in a "Post-UV+Heating" thickness (A) and "Post-UV+Heating" refractive index (n).

TABLE 1

| Pristine | | Post-IR | | UV + Heating | | Shrinkage | | | | | |
|---|---|---|---|---|---|---|---|---|---|---|---|
| Thickness (A) | n | Thickness (A) | n | Thickness (A) | n | Post-IR (%) | Post-UV (%) | UV (nm) | Time (min) | k | E (GPa) |
| 5860 | 1.498 | 5609 | 1.282 | 4837 | 1.34 | 4.3 | 17.5 | 172 | 10 | 2.29 | 5.37 |
| 5880 | 1.495 | 5644 | 1.291 | 5335 | 1.309 | 4 | 9.3 | 222 | 5 | 2.09 | 3.69 |
| 5951 | 1.492 | 5651 | 1.28 | 5285 | 1.309 | 5 | 11.2 | 222 | 10 | 2.11 | 4.44 |

Referring still to Table 1, the shrinkage (%) in film thickness is provided Post-IR and Post-UV+Heating. Additionally, the UV wavelength and UV exposure time (minutes, min) are provided. Furthermore, the dielectric constant (k) and the elastic modulus (E) (GPa) are provided for the resultant, cured porous low-k dielectric film. As shown in Table 1, the use of IR radiation preceding UV radiation and heating leads to dielectric constants less than 2.3 and as low as 2.09. Moreover, a low dielectric constant, i.e., k=2.11, can be achieved while acceptable mechanical properties, i.e., E=4.44 GPa, can also be achieved.

For comparison purposes, SiCOH-containing dielectric films, formed using the same CVD process, were cured without exposure to IR radiation. Without IR exposure, the "Post-UV+Heating" refractive index ranges from about 1.408 to about 1.434, which is significantly higher than the results provided in Table 1. The higher refractive index may indicate an excess of residual pore-generating material in the film, e.g., less porous film, and/or oxidation of the film.

According to yet another example, a method of preparing a porous low-k dielectric film on a substrate is described. The method comprises: forming a SiCOH-containing dielectric film on a substrate using a chemical vapor deposition (CVD) process, wherein the CVD process uses diethoxymethylsilane (DEMS) and a pore-generating material; exposing the SiCOH-containing dielectric film to first IR radiation for a first time duration sufficiently long to substantially remove the pore-generating material; exposing the SiCOH-containing dielectric film to UV radiation for a second time duration following the first IR exposure; exposing the SiCOH-containing dielectric film to second IR radiation for a third time duration during the UV exposure; and exposing the SiCOH-containing dielectric film to third IR radiation for a fourth time duration following the UV exposure.

The method may further comprise heating the SiCOH-containing dielectric film during part or all of the second time duration. Additionally, the third time duration may coincide with the second time duration.

The exposure of the SiCOH-containing dielectric film to first IR radiation can comprise IR radiation with a wavelength ranging from approximately 9 microns to approximately 10 microns (e.g., 9.4 microns). The exposure of the SiCOH-containing dielectric film to UV radiation can comprise UV radiation with a wavelength ranging from approximately 170 nanometers to approximately 230 nanometers (e.g., 222 nm). The exposure of the SiCOH-containing dielectric film to second IR radiation can comprise IR radiation with a wavelength ranging from approximately 9 microns to approximately 10 microns (e.g., 9.4 microns). The exposure of the SiCOH-containing dielectric film to third IR radiation can comprise IR radiation with a wavelength ranging from approximately 9 microns to approximately 10 microns (e.g., 9.4 microns). The heating of the SiCOH-containing dielectric film can comprise heating the substrate to a temperature ranging from approximately 300 degrees C. to approximately 500 degrees C.

The pore-generating material may comprise a terpene; a norbornene; 5-dimethyl-1,4-cyclooctadiene; decahydronaphthalene; ethylbenzene; or limonene; or a combination of two or more thereof. For example, the pore-generating material may comprise alpha-terpinene (ATRP).

Table 2 provides data for a porous low-k dielectric film intended to have a dielectric constant of about 2.2 to 2.25. The porous low-k dielectric film comprises a porous SiCOH-containing dielectric film formed with a CVD process using a structure-forming material comprising diethoxymethylsilane (DEMS) and a pore-generating material comprising alpha-terpinene (ATRP). The "Pristine" SiCOH-containing dielectric film having a nominal thickness (Angstroms, A) and refractive index (n) is cured using two processes, namely: (1) a conventional UV/Thermal process (i.e., no IR exposure); and (2) a curing process wherein the pristine film is exposed to IR radiation (9.4 micron), followed by exposure to IR radiation (9.4 micron) and UV radiation (222 nm), followed by exposure to IR radiation (9.4 micron).

TABLE 2

| Pristine | | Post-UV/Thermal | | | | | |
|---|---|---|---|---|---|---|---|
| Thickness (A) | n | Thickness (A) | n | Shrinkage Post-(%) | k | E (GPa) | H (GPa) |
| 6100 | 1.495 | 5350 | 1.329 | 13 | 2.2 | 4.51 | 0.45 |
| Pristine | | Post-IR + UV/IR + IR | | | | | |
| Thickness (A) | n | Thickness (A) | n | Shrinkage Post-(%) | k | E (GPa) | H (GPa) |
| 6137 | 1.488 | 5739 | 1.282 | 6.5 | 2.1 | 3.99 | 0.28 |
| 6107 | 1.5 | 5473 | 1.297 | 10.4 | 2.1 | 4.26 | 0.35 |
| 6173 | 1.498 | 5483 | 1.302 | 11.2 | 2.1 | 4.71 | 0.46 |
| 6135 | 1.499 | 5374 | 1.306 | 12.4 | 2.1 | 4.78 | 0.48 |

Table 2 provides the "Post-UV/Thermal" thickness (A) and "Post-UV/Thermal" refractive index (n) for the conventional UV/Thermal process, and the "Post-IR+UV/IR+IR" thickness (A) and "Post-IR+UV/IR+IR" refractive index (n) for the IR+UV/IR+IR process. Additionally, the shrinkage (%) in film thickness is provided Post-UV/Thermal and Post-IR+UV/IR+IR. Furthermore, the dielectric constant (k), the elastic modulus (E) (GPa) and the hardness (H) (GPa) are provided for the resultant, cured porous low-k dielectric film. As shown in Table 2, the use of IR radiation preceding UV radiation and heating, as well as during and after the UV exposure, leads to dielectric constants less than 2.1. Moreover, a low dielectric constant, i.e., k=2.1, can be achieved while acceptable mechanical properties, i.e., E=4.71 GPa and H=0.46 GPa, can also be achieved. Comparatively speaking, the IR+UV/IR+IR curing process produces a lower dielectric constant (k=2.1) with less film thickness shrinkage. Moreover, the mechanical properties (E and H) are approximately the same for the two curing processes.

As a result, the use of IR exposure and UV exposure can lead to the formation of a diethoxymethylsilane (DEMS)-based, porous dielectric film comprising a dielectric constant of about 2.1 or less, a refractive index of about 1.31 or less, an elastic modulus of about 4 GPa or greater, and a hardness of about 0.45 GPa or greater.

Table 3 provides data for a porous low-k dielectric film intended to have a dielectric constant of about 2. The porous low-k dielectric film comprises a porous SiCOH-containing dielectric film formed with a CVD process using a structure-forming material comprising diethoxymethylsilane (DEMS) and a pore-generating material comprising alpha-terpinene (ATRP). The pristine SiCOH-containing dielectric film is cured using four processes, namely: (1) a conventional UV/Thermal process (i.e., no IR exposure); (2) a curing process wherein the pristine film is exposed to IR radiation only (9.4 micron); (3) a curing process wherein the pristine film is exposed to IR radiation (9.4 micron) followed by a conventional UV/Thermal process; and (4) a curing process wherein the pristine film is exposed to IR radiation (9.4 micron), followed by exposure to IR radiation (9.4 micron) and UV radiation (222 nm), followed by exposure to IR radiation (9.4 micron).

TABLE 3

| Process type | n | Shrinkage (%) | k | E (GPa) | H (GPa) |
| --- | --- | --- | --- | --- | --- |
| UV/Thermal | 1.275 | 33 | 1.92 | 2.52 | 0.28 |
| IR only | 1.174 | 15 | 1.66 | 1.2 | 0.1 |
| IR + UV/Thermal | 1.172 | 29 | 1.65 | 2.4 | 0.33 |
| IR + UV/IR + IR | 1.172 | 26 | 1.68 | 2.34 | 0.28 |
| | 1.164 | 29 | 1.66 | 2.08 | 0.25 |

Table 3 provides the resulting refractive index (n), shrinkage (%), dielectric constant (k), elastic modulus (E) (GPa) and hardness (H) (GPa) following each of the curing processes. As shown in Table 3, the use of IR radiation (with or without UV radiation) leads to a dielectric constant less than 1.7 (as opposed to greater than 1.9). When using only IR radiation to cure the pristine film, a low dielectric constant, i.e., k=1.66, can be achieved while acceptable mechanical properties, i.e., E=1.2 GPa and H=0.1 GPa, can also be achieved. However, when using IR radiation and UV radiation to cure the pristine film, a low dielectric constant, i.e., k=1.68, can be achieved while improved mechanical properties, i.e., E=2.34 GPa and H=0.28 GPa, can also be achieved. Additionally, the curing processes using IR radiation produce a lower dielectric constant (k=1.66 to 1.68) with less film thickness shrinkage. Further, when IR radiation is used, the mechanical properties (E and H) can be improved by using UV radiation.

As a result, the use of IR exposure and UV exposure can lead to the formation of a diethoxymethylsilane (DEMS)-based, porous dielectric film comprising a dielectric constant of about 1.7 or less, a refractive index of about 1.17 or less, an elastic modulus of about 1.5 GPa or greater, and a hardness of about 0.2 GPa or greater.

Figure 5A:
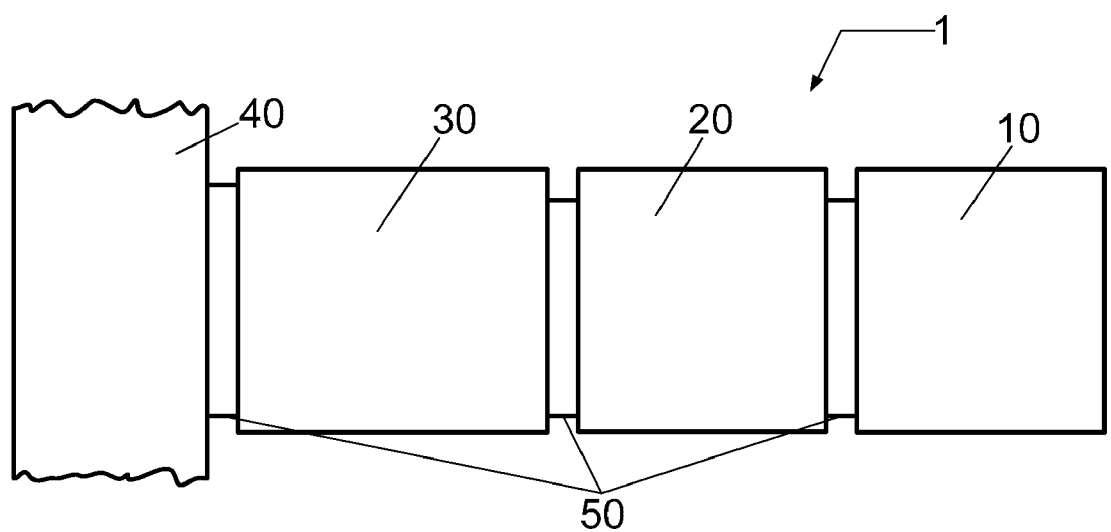
FIGS. 5A through 5C are schematic representations of a transfer system for a drying system and a curing system according to an embodiment.

According to one embodiment, FIG. 5A shows a processing system 1 for treating a dielectric film on a substrate, according to one embodiment. The processing system 1 includes a drying system 20, and a curing system 10 coupled to the drying system 20. For example, the drying system 10 can be configured to remove, or reduce to sufficient levels, one or more contaminants, pore-generating materials, and/or cross-linking inhibitors in the dielectric film, including, for example, moisture, water, solvent, contaminants, pore-generating material, residual pore-generating material, a weakly bonded side group to the structure-forming material, pore-generating molecules, fragments of pore-generating molecules, cross-linking inhibitors, fragments of cross-linking inhibitors, or any other contaminant that may interfere with a curing process performed in the curing system 10.

For example, a sufficient reduction of a specific contaminant present within the dielectric film, from prior to the drying process to following the drying process, can include a reduction of approximately 10% to approximately 100% of the specific contaminant. The level of contaminant reduction may be measured using Fourier transform infrared (FTIR) spectroscopy, or mass spectroscopy. Alternatively, for example, a sufficient reduction of a specific contaminant present within the dielectric film can range from approximately 50% to approximately 100%. Alternatively, for example, a sufficient reduction of a specific contaminant present within the dielectric film can range from approximately 80% to approximately 100%.

Referring still to FIG. 5A, the curing system 10 may be configured to cure the dielectric film by causing or partially causing cross-linking within the dielectric film in order to, for example, improve the mechanical properties of the dielectric film. Furthermore, the curing system 10 may be configured to cure the dielectric film by causing or partially causing cross-link initiation, removal of pore-generating material, decomposition of pore-generating material, etc. The curing system 10 can include one or more radiation sources configured to expose the substrate having the dielectric film to electromagnetic (EM) radiation at multiple EM wavelengths. For example, the one or more radiation sources can include an infrared (IR) radiation source and an ultraviolet (UV) radiation source. The exposure of the substrate to UV radiation and IR radiation can be performed simultaneously, sequentially, or partially over-lapping one another. During sequential exposure, the exposure of the substrate to UV radiation can, for instance, precede the exposure of the substrate to IR radiation or follow the exposure of the substrate to IR radiation or both. Additionally, during sequential exposure, the exposure of the substrate to IR radiation can, for instance, precede the exposure of the substrate to UV radiation or follow the exposure of the substrate to UV radiation or both.

For example, the IR radiation can include an IR radiation source ranging from approximately 1 micron to approximately 25 microns. Additionally, for example, the IR radiation may range from about 2 microns to about 20 microns, or from about 8 microns to about 14 microns, or from about 8 microns to about 12 microns, or from about 9 microns to about 10 microns. Additionally, for example, the UV radiation can include a UV wave-band source producing radiation ranging from approximately 100 nanometers (nm) to approximately 600 nm. Furthermore, for example, the UV radiation may range from about 200 nm to about 400 nm, or from about 150 nm to about 300 nm, or from about 170 to about 240 nm, or from about 200 nm to about 240 nm.

Also, as illustrated in FIG. 5A, a transfer system 30 can be coupled to the drying system 20 in order to transfer substrates into and out of the drying system 20 and the curing system 10, and exchange substrates with a multi-element manufacturing system 40. Transfer system 30 may transfer substrates to and from drying system 20 and curing system 10 while maintaining a vacuum environment. The drying and curing systems 20, 10, and the transfer system 30 can, for example, include a processing element within the multi-element manufacturing system 40. For example, the multi-element manufacturing system 40 can permit the transfer of substrates to and from processing elements including such devices as etch systems, deposition systems, coating systems, patterning systems, metrology systems, etc. In order to isolate the processes occurring in the first and second systems, an isolation assembly 50 can be utilized to couple each system. For instance, the isolation assembly 50 can include at least one of a thermal insulation assembly to provide thermal isolation, and a gate valve assembly to provide vacuum isolation. The drying and curing systems 20 and 10, and transfer system 30 can be placed in any sequence.

IR exposure of the substrate can be performed in the drying system 20, or the curing system 10, or a separate treatment system (not shown).

Figure 5B:
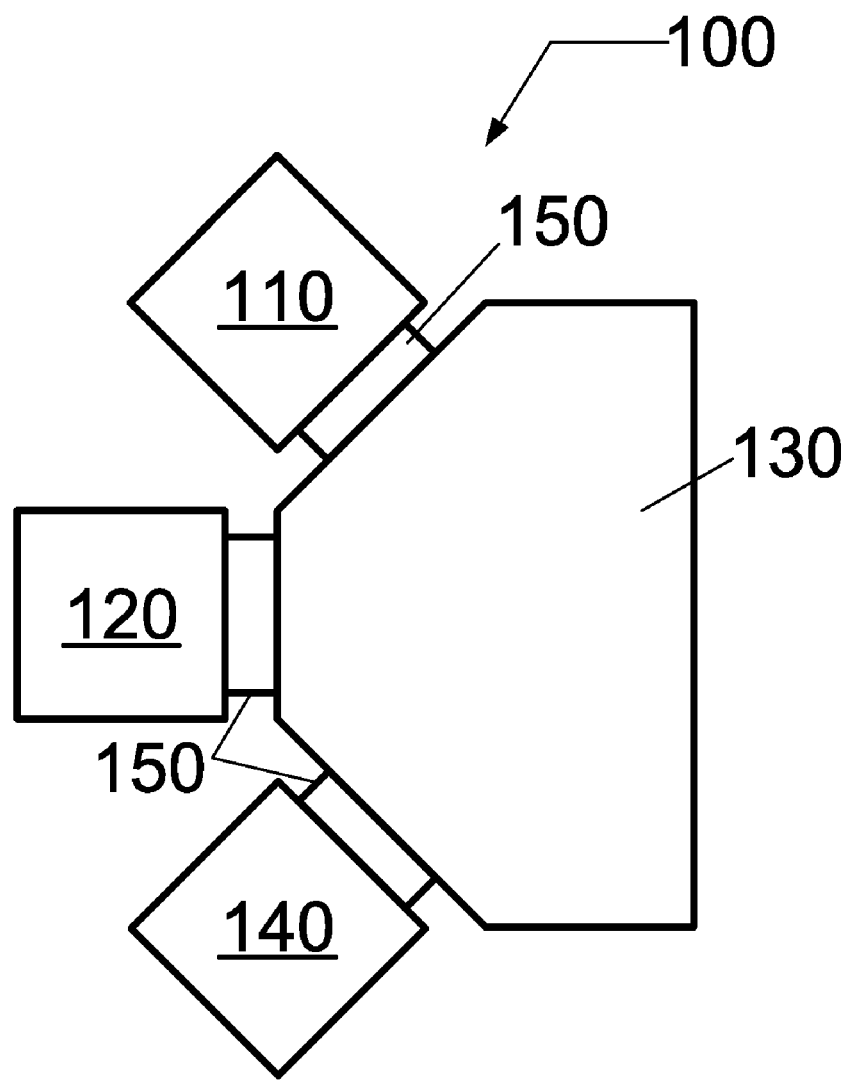

Alternately, in another embodiment of the invention, FIG. 5B shows a processing system 100 for treating a dielectric film on a substrate. The processing system 100 includes a "cluster-tool" arrangement for a drying system 110, and a curing system 120. For example, the drying system 110 can be configured to remove, or reduce to sufficient levels, one or more contaminants, pore-generating materials, and/or cross-linking inhibitors in the dielectric film, including, for example, moisture, water, solvent, contaminants, pore-generating material, residual pore-generating material, a weakly bonded side group to the structure-forming material, pore-generating molecules, fragments of pore-generating molecules, cross-linking inhibitors, fragments of cross-linking inhibitors, or any other contaminant that may interfere with a curing process performed in the curing system 120.

Additionally, for example, the curing system 120 can be configured to cure the dielectric film by causing or partially causing cross-linking within the dielectric film in order to, for example, improve the mechanical properties of the dielectric film. Furthermore, the processing system 100 can optionally include a post-treatment system 140 configured to modify the cured dielectric film. For example, post-treatment can include thermal heating. Additionally, for example, post-treatment can include spin coating or vapor depositing another film on the dielectric film in order to promote adhesion for subsequent films or improve hydrophobicity. Alternatively, for example, adhesion promotion may be achieved in a post-treatment system by lightly bombarding the dielectric film with ions by, for example, exposing the substrate to plasma.

Also, as illustrated in FIG. 5B, a transfer system 130 can be coupled to the drying system 110 in order to transfer substrates into and out of the drying system 110, and can be coupled to the curing system 120 in order to transfer substrates into and out of the curing system 120, and can be coupled to the optional post-treatment system 140 in order to transfer substrates into and out of the post-treatment system 140. Transfer system 130 may transfer substrates to and from drying system 110, curing system 120 and optional post-treatment system 140 while maintaining a vacuum environment.

Additionally, transfer system 130 can exchange substrates with one or more substrate cassettes (not shown). Although only two or three process systems are illustrated in FIG. 5B, other process systems can access transfer system 130 including for example such devices as etch systems, deposition systems, coating systems, patterning systems, metrology systems, etc. In order to isolate the processes occurring in the drying and curing systems, an isolation assembly 150 can be utilized to couple each system. For instance, the isolation assembly 150 can include at least one of a thermal insulation assembly to provide thermal isolation, and a gate valve assembly to provide vacuum isolation. Additionally, for example, the transfer system 130 can serve as part of the isolation assembly 150.

IR exposure of the substrate can be performed in the drying system 110, or the curing system 120, or a separate treatment system (not shown).

Figure 5C:
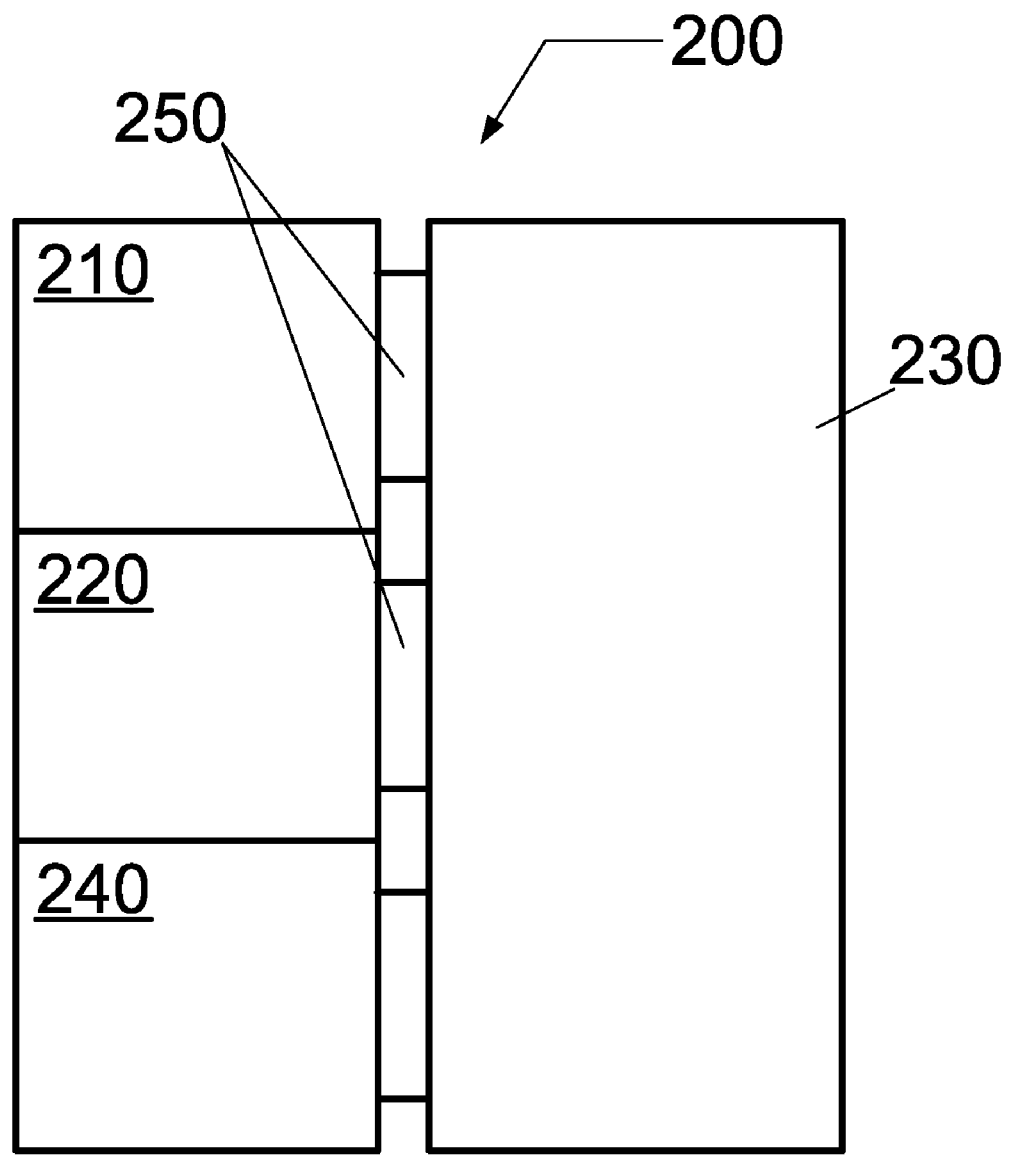

Alternately, in another embodiment of the invention, FIG. 5C shows a processing system 200 for treating a dielectric film on a substrate. The processing system 200 includes a drying system 210, and a curing system 220. For example, the drying system 210 can be configured to remove, or reduce to sufficient levels, one or more contaminants, pore-generating materials, and/or cross-linking inhibitors in the dielectric film, including, for example, moisture, water, solvent, contaminants, pore-generating material, residual pore-generating material, a weakly bonded side group to the structure-forming material, pore-generating molecules, fragments of pore-generating molecules, cross-linking inhibitors, fragments of cross-linking inhibitors, or any other contaminant that may interfere with a curing process performed in the curing system 220.

Additionally, for example, the curing system 220 can be configured to cure the dielectric film by causing or partially causing cross-linking within the dielectric film in order to, for example, improve the mechanical properties of the dielectric film. Furthermore, the processing system 200 can optionally include a post-treatment system 240 configured to modify the cured dielectric film. For example, post-treatment can include thermal heating. Additionally, for example, post-treatment can include spin coating or vapor depositing another film on the dielectric film in order to promote adhesion for subsequent films or improve hydrophobicity. Alternatively, for example, adhesion promotion may be achieved in a post-treatment system by lightly bombarding the dielectric film with ions by, for example, exposing the substrate to plasma.

Drying system 210, curing system 220, and post-treatment system 240 can be arranged horizontally or may be arranged vertically (i.e., stacked). Also, as illustrated in FIG. 5C, a transfer system 230 can be coupled to the drying system 210 in order to transfer substrates into and out of the drying system 210, can be coupled to the curing system 220 in order to transfer substrates into and out of the curing system 220, and can be coupled to the optional post-treatment system 240 in order to transfer substrates into and out of the post-treatment system 240. Transfer system 230 may transfer substrates to and from drying system 210, curing system 220 and optional post-treatment system 240 while maintaining a vacuum environment.

Additionally, transfer system 230 can exchange substrates with one or more substrate cassettes (not shown). Although only three process systems are illustrated in FIG. 5C, other process systems can access transfer system 230 including for example such devices as etch systems, deposition systems, coating systems, patterning systems, metrology systems, etc. In order to isolate the processes occurring in the first and second systems, an isolation assembly 250 can be utilized to couple each system. For instance, the isolation assembly 250 can include at least one of a thermal insulation assembly to provide thermal isolation, and a gate valve assembly to provide vacuum isolation. Additionally, for example, the transfer system 230 can serve as part of the isolation assembly 250.

IR exposure of the substrate can be performed in the drying system 210, or the curing system 220, or a separate treatment system (not shown).

At least one of the drying system 20 and the curing system 10 of the processing system 1 as depicted in FIG. 5A includes at least two transfer openings to permit the passage of the substrate therethrough. For example, as depicted in FIG. 5A, the drying system 20 includes two transfer openings, the first transfer opening permits the passage of the substrate between the drying system 20 and the transfer system 30 and the second transfer opening permits the passage of the substrate between the drying system 20 and the curing system 10. However, regarding the processing system 100 depicted in FIG. 5B and the processing system 200 depicted in FIG. 5C, each treatment system 110, 120, 140 and 210, 220, 240, respectively, includes at least one transfer opening to permit the passage of the substrate therethrough.

Figure 6:
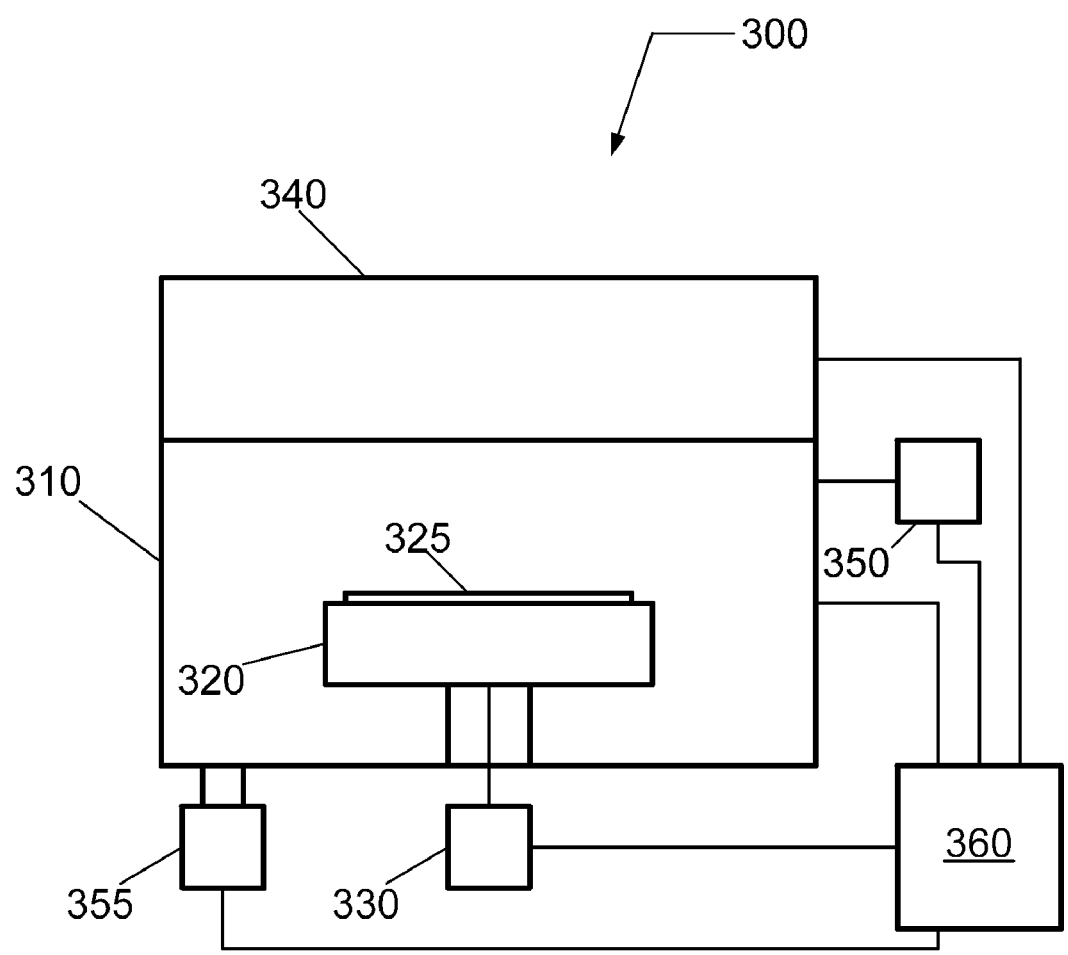
FIG. 6 is a schematic cross-sectional view of a drying system according to another embodiment.

Referring now to FIG. 6, a drying system 300 is shown according to another embodiment of the invention. Drying system 300 includes a drying chamber 310 configured to produce a clean, contaminant-free environment for drying a substrate 325 resting on substrate holder 320. The drying system 300 can include a thermal treatment device 330 coupled to drying chamber 310, or to substrate holder 320, and configured to evaporate contaminants, such as for example moisture, water, residual solvent, etc., by elevating the temperature of substrate 325. Furthermore, the drying system 300 can include a microwave treatment device 340 coupled to the drying chamber 310, and configured to locally heat contaminants in the presence of an oscillating electric field. The drying process can utilize the thermal treatment device 330, or the microwave treatment device 340, or both to facilitate drying a dielectric film on substrate 325.

The thermal treatment device 330 can include one or more conductive heating elements embedded in substrate holder 320 coupled to a power source and a temperature controller. For example, each heating element can include a resistive heating element coupled to a power source configured to supply electrical power. Alternatively, the thermal treatment device 330 can include one or more radiative heating elements coupled to a power source and a controller. For example, each radiative heating element can include a heat lamp coupled to a power source configured to supply electrical power. The temperature of substrate 325 can, for example, range from approximately 20 degrees C. to approximately 600 degrees C., and desirably, the temperature may range from approximately 200 degrees C. to approximately 600 degrees C. For example, the temperature of substrate 325 can range from approximately 300 degrees C. to approximately 500 degrees C., or from approximately 350 degrees C. to approximately 450 degrees C.

The microwave treatment source 340 can include a variable frequency microwave source configured to sweep the microwave frequency through a bandwidth of frequencies. Frequency variation avoids charge build-up and, hence, permits damage-free application of microwave drying techniques to sensitive electronic devices.

In one example, the drying system 300 can include a drying system incorporating both a variable frequency microwave device and a thermal treatment device, such as for example the microwave furnace commercially available from Lambda Technologies, Inc. (860 Aviation Parkway, Suite 900, Morrisville, N.C. 27560).

The substrate holder 320 may or may not be configured to clamp substrate 325. For instance, substrate holder 320 may be configured to mechanically or electrically clamp substrate 325.

Further, drying system 300 may include an IR radiation source for exposing the substrate 325 to IR radiation.

Referring again to FIG. 6, drying system 300 can further include a gas injection system 350 coupled to the drying chamber and configured to introduce a purge gas to drying chamber 310. The purge gas can, for example, include an inert gas, such as a noble gas or nitrogen. Additionally, drying system 300 can include a vacuum pumping system 355 coupled to drying chamber 310 and configured to evacuate the drying chamber 310. During a drying process, substrate 325 can be subject to an inert gas environment with or without vacuum conditions.

Furthermore, drying system 300 can include a controller 360 coupled to drying chamber 310, substrate holder 320, thermal treatment device 330, microwave treatment device 340, gas injection system 350, and vacuum pumping system 355. Controller 360 includes a microprocessor, a memory, and a digital I/O port capable of generating control voltages sufficient to communicate and activate inputs to the drying system 300 as well as monitor outputs from the drying system 300. A program stored in the memory is utilized to interact with the drying system 300 according to a stored process recipe. The controller 360 can be used to configure any number of processing elements (310, 320, 330, 340, 350, or 355), and the controller 360 can collect, provide, process, store, and display data from processing elements. The controller 360 can include a number of applications for controlling one or more of the processing elements. For example, controller 360 can include a graphic user interface (GUI) component (not shown) that can provide interfaces that enable a user to monitor and/or control one or more processing elements.

Figure 7:
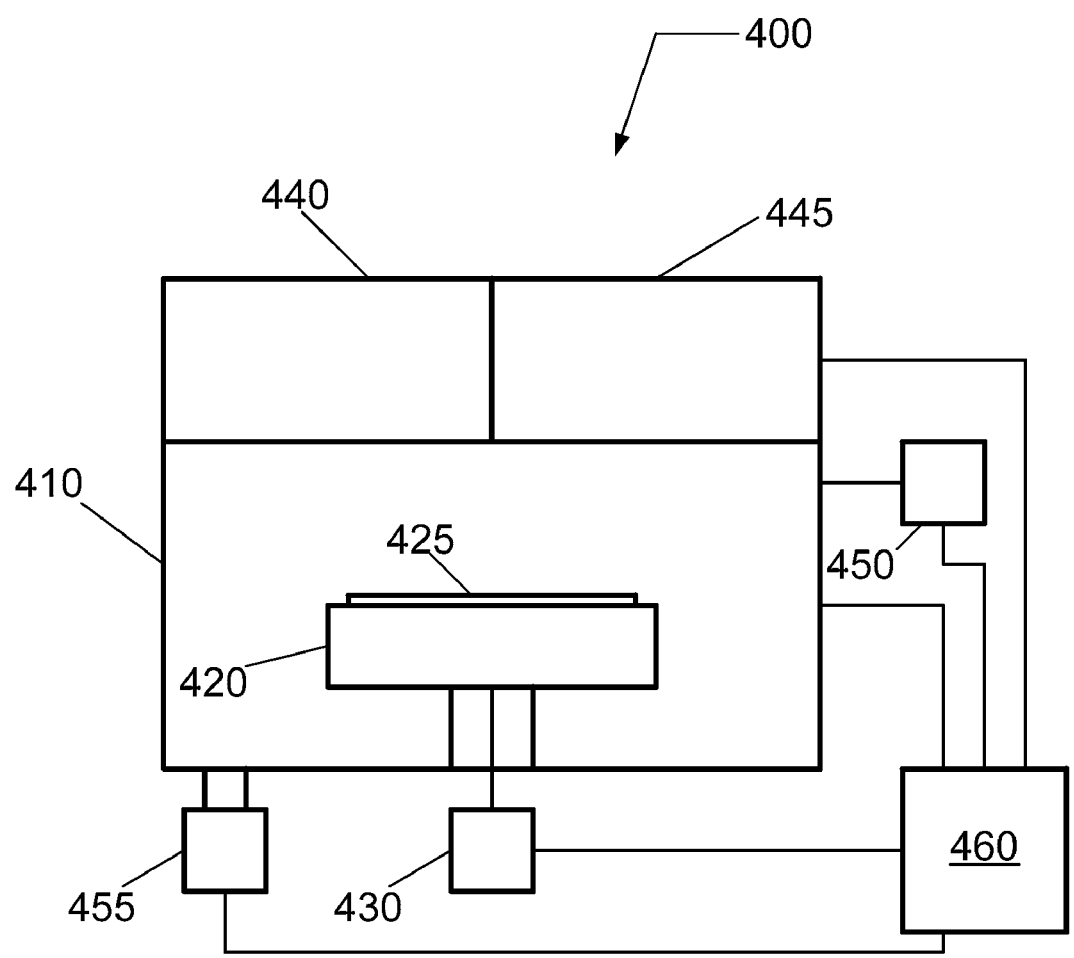
FIG. 7 is a schematic cross-sectional view of a curing system according to another embodiment.

Referring now to FIG. 7, a curing system 400 is shown according to another embodiment of the present invention. Curing system 400 includes a curing chamber 410 configured to produce a clean, contaminant-free environment for curing a substrate 425 resting on substrate holder 420. Curing system 400 further includes one or more radiation sources configured to expose substrate 425 having the dielectric film to electromagnetic (EM) radiation at single, multiple, narrow-band, or broadband EM wavelengths. The one or more radiation sources can include an optional infrared (IR) radiation source 440 and an ultraviolet (UV) radiation source 445. The exposure of the substrate to UV radiation and optionally IR radiation can be performed simultaneously, sequentially, or overlapping one another.

The IR radiation source 440 may include a broad-band IR source (e.g., polychromatic), or may include a narrow-band IR source (e.g., monochromatic). The IR radiation source may include one or more IR lamps, one or more IR LEDs, or one or more IR lasers (continuous wave (CW), tunable, or pulsed), or any combination thereof. The IR power density may range up to about 20 W/cm$^2$. For example, the IR power density may range from about 1 W/cm$^2$ to about 20 W/cm$^2$. The IR radiation wavelength may range from approximately 1 micron to approximately 25 microns. Alternatively, the IR radiation wavelength may range from approximately 8 microns to approximately 14 microns. Alternatively, the IR radiation wavelength may range from approximately 8 microns to approximately 12 microns. Alternatively, the IR radiation wavelength may range from approximately 9 microns to approximately 10 microns. For example, the IR radiation source 440 may include a $CO_2$ laser system. Additional, for example, the IR radiation source 440 may include an IR element, such as a ceramic element or silicon carbide element, having a spectral output ranging from approximately 1 micron to approximately 25 microns, or the IR radiation source 440 can include a semiconductor laser (diode), or ion, Ti:sapphire, or dye laser with optical parametric amplification.

The UV radiation source 445 may include a broad-band UV source (e.g., polychromatic), or may include a narrow-band UV source (e.g., monochromatic). The UV radiation source may include one or more UV lamps, one or more UV LEDs, or one or more UV lasers (continuous wave (CW), tunable, or pulsed), or any combination thereof. UV radiation may be generated, for instance, from a microwave source, an arc discharge, a dielectric barrier discharge, or electron impact generation. The UV power density may range from approximately 0.1 mW/cm$^2$ to approximately 2000 mW/cm$^2$. The UV wavelength may range from approximately 100 nanometers (nm) to approximately 600 nm. Alternatively, the UV radiation may range from approximately 200 nm to approximately 400 nm. Alternatively, the UV radiation may range from approximately 150 nm to approximately 300 nm. Alternatively, the UV radiation may range from approximately 170 nm to approximately 240 nm. Alternatively, the UV radiation may range from approximately 200 nm to approximately 240 nm. For example, the UV radiation source 445 may include a direct current (DC) or pulsed lamp, such as a Deuterium (D$_2$) lamp, having a spectral output ranging from approximately 180 nm to approximately 500 nm, or the UV radiation source 445 may include a semiconductor laser (diode), (nitrogen) gas laser, frequency-tripled (or quadrupled) Nd:YAG laser, or copper vapor laser.

The IR radiation source 440, or the UV radiation source 445, or both, may include any number of optical device to adjust one or more properties of the output radiation. For example, each source may further include optical filters, optical lenses, beam expanders, beam collimators, etc. Such optical manipulation devices as known to those skilled in the art of optics and EM wave propagation are suitable for the invention.

The substrate holder 420 can further include a temperature control system that can be configured to elevate and/or control the temperature of substrate 425. The temperature control system can be a part of a thermal treatment device 430. The substrate holder 420 can include one or more conductive heating elements embedded in substrate holder 420 coupled to a power source and a temperature controller. For example, each heating element can include a resistive heating element coupled to a power source configured to supply electrical power. The substrate holder 420 could optionally include one or more radiative heating elements. The temperature of substrate 425 can, for example, range from approximately 20 degrees C. to approximately 600 degrees C., and desirably, the temperature may range from approximately 200 degrees C. to approximately 600 degrees C. For example, the temperature of substrate 425 can range from approximately 300 degrees C. to approximately 500 degrees C., or from approximately 350 degrees C. to approximately 450 degrees C.

Additionally, the substrate holder 420 may or may not be configured to clamp substrate 425. For instance, substrate holder 420 may be configured to mechanically or electrically clamp substrate 425.

Referring again to FIG. 7, curing system 400 can further include a gas injection system 450 coupled to the curing chamber 410 and configured to introduce a purge gas to curing chamber 410. The purge gas can, for example, include an inert gas, such as a noble gas or nitrogen. Alternatively, the purge gas can include other gases, such as for example H$_2$, NH$_3$, C$_x$H$_y$, or any combination thereof. Additionally, curing system 400 can further include a vacuum pumping system 455 coupled to curing chamber 410 and configured to evacuate the curing chamber 410. During a curing process, substrate 425 can be subject to a purge gas environment with or without vacuum conditions.

Furthermore, curing system 400 can include a controller 460 coupled to curing chamber 410, substrate holder 420, thermal treatment device 430, IR radiation source 440, UV radiation source 445, gas injection system 450, and vacuum pumping system 455. Controller 460 includes a microprocessor, a memory, and a digital I/O port capable of generating control voltages sufficient to communicate and activate inputs to the curing system 400 as well as monitor outputs from the curing system 400. A program stored in the memory is utilized to interact with the curing system 400 according to a stored process recipe. The controller 460 can be used to configure any number of processing elements (410, 420, 430, 440, 445, 450, or 455), and the controller 460 can collect, provide, process, store, and display data from processing elements. The controller 460 can include a number of applications for controlling one or more of the processing elements. For example, controller 460 can include a graphic user interface (GUI) component (not shown) that can provide easy to use interfaces that enable a user to monitor and/or control one or more processing elements.

The controllers 360 and 460 may be implemented as a DELL PRECISION WORKSTATION 610™. The controllers 360 and 460 may also be implemented as a general purpose computer, processor, digital signal processor, etc., which causes a substrate processing apparatus to perform a portion or all of the processing steps of the invention in response to the controllers 360 and 460 executing one or more sequences of one or more instructions contained in a computer readable medium. The computer readable medium or memory is for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

The controllers 360 and 460 may be locally located relative to the drying system 300 and curing system 400, or may be remotely located relative to the drying system 300 and curing system 400 via an internet or intranet. Thus, the controllers 360 and 460 can exchange data with the drying system 300 and curing system 400 using at least one of a direct connection, an intranet, and the internet. The controllers 360 and 460 may be coupled to an intranet at a customer site (i.e., a device maker, etc.), or coupled to an intranet at a vendor site (i.e., an equipment manufacturer). Furthermore, another computer (i.e., controller, server, etc.) can access controllers 360 and 460 to exchange data via at least one of a direct connection, an intranet, and the internet.

Furthermore, embodiments of this invention may be used as or to support a software program executed upon some form of processing core (such as a processor of a computer, e.g., controller 360 or 460) or otherwise implemented or realized upon or within a machine-readable medium. A machine-readable medium includes any mechanism for storing information in a form readable by a machine (e.g., a computer). For example, a machine-readable medium can include media such as a read only memory (ROM); a random access memory (RAM); a magnetic disk storage media; an optical storage media; and a flash memory device, etc.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method of curing a low dielectric constant (low-k) dielectric film on a substrate, comprising:

forming a low-k dielectric film on a substrate;
exposing said low-k dielectric film to a first infrared (IR) radiation;
exposing said low-k dielectric film to ultraviolet (UV) radiation following said exposure to said first IR radiation; and
exposing said low-k dielectric film to a second infrared (IR) radiation following said exposure to said UV radiation,
wherein a dielectric constant of said low-k dielectric film is less than a value of approximately 4.

2. The method of claim 1, further comprising:
during said first IR exposure, heating said low-k dielectric film by elevating a temperature of said substrate to a first IR thermal treatment temperature ranging from approximately 200 degrees C. to approximately 600 degrees C.

3. The method of claim 2, wherein said first IR thermal treatment temperature ranges from approximately 350 degrees C. to approximately 450 degrees C.

4. The method of claim 1, further comprising:
during said UV exposure, heating said low-k dielectric film by elevating a temperature of said substrate to a UV thermal temperature ranging from approximately 200 degrees C. to approximately 600 degrees C.

5. The method of claim 4, wherein said UV thermal temperature ranges from approximately 300 degrees C. to approximately 500 degrees C.

6. The method of claim 1, further comprising:
during said second IR exposure, heating said low-k dielectric film by elevating a temperature of said substrate to a second IR thermal treatment temperature ranging from approximately 200 degrees C. to approximately 600 degrees C.

7. The method of claim 6, wherein said second IR thermal treatment temperature ranges from approximately 350 degrees C. to approximately 450 degrees C.

8. The method of claim 1, wherein said first IR exposure is performed in a process system different from said UV exposure.

9. The method of claim 1, wherein said first IR exposure is performed in the same process system as said UV exposure.

10. The method of claim 1, wherein said exposing said low-k dielectric film to UV radiation comprises exposing said low-k dielectric film to polychromatic UV radiation, monochromatic UV radiation, pulsed UV radiation, or continuous wave UV radiation, or a combination of two or more thereof 11. The method of claim 1, wherein said exposing said low-k dielectric film to UV radiation comprises exposing said low-k dielectric film to UV radiation from one or more UV lamps, one or more UV LEDs, or one or more UV lasers, or a combination of two or more thereof 12. The method of claim 1, wherein said exposing said low-k dielectric film to UV radiation comprises exposing said low-k dielectric film to UV radiation with a wavelength ranging from approximately 200 nanometers to approximately 400 nanometers.

13. The method of claim 1, wherein said exposing said low-k dielectric film to UV radiation comprises exposing said low-k dielectric film to UV radiation with a wavelength ranging from approximately 200 nanometers to approximately 240 nanometers.

14. The method of claim 1, wherein said exposing said low-k dielectric film to said first IR radiation comprises exposing said low-k dielectric film to polychromatic IR radiation, monochromatic IR radiation, pulsed IR radiation, or continuous wave IR radiation, or a combination of two or more thereof 15. The method of claim 1, wherein said exposing said low-k dielectric film to said first IR radiation comprises exposing said low-k dielectric film to IR radiation from one or more IR lamps, one or more IR LEDs, or one or more IR lasers, or a combination of two or more thereof 16. The method of claim 1, wherein said exposing said low-k dielectric film to said first IR radiation or said second IR radiation comprises exposing said low-k dielectric film to IR radiation with a wavelength ranging from approximately 8 micron to approximately 12 microns.

17. The method of claim 1, wherein said exposing said low-k dielectric film to UV radiation further comprises:
exposing said low-k dielectric film to third IR radiation during at least a portion of said UV exposure.

18. The method of claim 17, wherein said exposing said low-k dielectric film to said third IR radiation comprises exposing said low-k dielectric film to IR radiation with a wavelength_ ranging from approximately 8 microns to approximately 12 microns.

19. The method of claim 1, further comprising:
treating said dielectric film following said second IR exposure by performing one or more of depositing another film on said dielectric film, cleaning said dielectric film, or exposing said dielectric film to plasma.

20. The method of claim 1, wherein said low-k dielectric film comprises a porous low-k dielectric film comprising a structure-forming material and a pore-generating material.

21. The method of claim 20, wherein said structure-forming material comprises diethoxymethylsilane (DEMS).

22. The method of claim 20, wherein said pore-generating material comprises a terpene; a norbornene; 5-dimethyl-1,4-cyclooctadiene;
decahydronaphthalene; ethylbenzene; or limonene; or a combination of two or more thereof 23. The method of claim 1, further comprising:
exposing said low-k dielectric film to second UV radiation during said first IR exposure, wherein said second UV radiation is different than said UV radiation following said first IR exposure.

24. The method of claim 23, wherein said second UV radiation comprises exposing said low-k dielectric film to UV radiation with a wavelength ranging from approximately 300 nanometers to approximately 450 nanometers.

25. A method of curing a low dielectric constant (low-k) dielectric film on a substrate, comprising:
forming a low-k dielectric film on a substrate, said low-k dielectric film comprising a structure-forming material and a pore-generating material;
substantially removing said pore-generating material from said low-k dielectric film to form a porous low-k dielectric film;
generating cross-linking initiators in said porous low-k dielectric film following said removing; and
cross-linking said porous low-k dielectric film following said generation of said cross-linking initiators.

26. The method of claim 25, further comprising:
breaking bonds in said low-k dielectric film in order to assist said removing.

* * * * *